United States Patent [19]

Nakagawara

[11] Patent Number: 5,202,848
[45] Date of Patent: Apr. 13, 1993

[54] READ ONLY MEMORY DEVICE

[75] Inventor: Akira Nakagawara, Kanagawa, Japan

[73] Assignee: Sony Corporation, Tokyo, Japan

[21] Appl. No.: 603,931

[22] Filed: Oct. 26, 1990

[30] Foreign Application Priority Data

Oct. 27, 1989 [JP] Japan ................................ 1-280162

[51] Int. Cl.$^5$ .............................................. G11C 17/12
[52] U.S. Cl. .................................... 365/104; 365/184
[58] Field of Search ................ 365/103, 104, 184, 182, 365/94

[56] References Cited

U.S. PATENT DOCUMENTS

| | | | |
|---|---|---|---|
| 4,151,020 | 4/1979 | McElroy | 437/48 |
| 4,385,432 | 5/1983 | Kuo et al. | 29/571 |
| 5,051,809 | 9/1991 | Kiyohara | 365/182 X |

FOREIGN PATENT DOCUMENTS 0011835  6/1980  European Pat. Off. .

OTHER PUBLICATIONS

Session XII: High Density Memories, 1978 IEEE Int'l Solid-State Circuits Conference, ISSCC 78, Feb. 16, 1978, pp. 152–153.

High Noise Immunity Column Select/Sense Amplifier Circuit, IBM Technical Disclosure Bulletin, vol. 23, No. 6, Nov. 1980, pp. 2250–2254.

Method of Partitioning a CMOS ROM Array to Enhance Performance, IBM Technical Disclosure Bulletin, vol. 31, No. 5, Oct. 1988, pp. 304–305.

"Self-Aligned, Ion-Implanted Read-Only Memory", IBM Technical Disclosure Bulletin, vol. 23, No. 6, Nov. 1980, pp. 2245–2246.

*Primary Examiner*—Joseph A. Popek
*Attorney, Agent, or Firm*—Hill, Steadman & Simpson

[57] ABSTRACT

A read-only memory device includes a number of MIS transistors forming memory cells arranged in a matrix configuration to provide a NOR type memory device with high current driving capability for the memory cells. Bit lines and column lines are arranged alternately in common in each cell column so as to be used in common by adjacent memory cells in the word line extending direction. The bit lines for reading out signals from the memory cells function as the sources or drains of the MIS transistors of the memory cells, whereas the column lines for supplying the constant voltage to the memory cells function as the drains or sources of the MIS transistors of the memory cells. For column selection, there is provided a first selection switch for selecting a group consisting of a plurality of bit lines and a plurality of column lines. A second selection switch and a third selection switch are provided for selecting the bit line and the column line of the group, respectively. Since the bit lines and the column lines may be used fixedly, the second and third selection switches may be arranged with a layout allowance and, if these second and third selection switches are formed by MIS transistors similar to those of the memory cells, the direction in common with the memory cells may be the channel direction to contribute to improved circuit integration.

7 Claims, 16 Drawing Sheets

READ ONLY MEMORY DEVICE

BACKGROUND OF THE INVENTION

1. Field of the Invention

This invention relates to a read-only memory device adapted for reading out data programmed in a memory cell and, more particularly, to a read-only memory device having NOR type memory cells.

2. Description of the Prior Art

With the read-only memory device (ROMs) adapted for storing a large amount of data and reading out the stored data when necessary, a demand for a higher degree of integration has been raised in keeping pace with propagation of OA equipment or electric computers.

As a typical structure for realizing such high integration, there is known a mask ROM having a NAND type cell circuit construction which has a so-called multi-gate structure provided with a gate electrode layer formed by two polysilicon layers, and a shallow groove or trench, as disclosed for example in "8M and 16M mask ROM Employing Shallow Trench" in a monthly magazine entitled "Semiconductor World", October, 1987, pages 33 to 38. On the other hand, there is known a mask ROM having a NOR type cell circuit construction which has its source-drain region constructed by a diffusion region, as disclosed for example in "16 Mb ROM Design Using Bank Select Architecture" in 1988 Symposium on VLSL circuits, Japan Association of Applied Physics, material, VL-7, pages 85 to 86.

FIG. 1 is a circuit diagram showing essential portions of the mask ROM having the NOR type memory cells. With this mask ROM, each of the memory cells 200 arranged in a matrix configuration and adapted to be selected by word lines $W_1$ to $W_8$ is constituted by each one MOS transistor, the source-drain region of which is formed by a diffusion region which proves to be common bit lines 205, 206 and 207 for each column. With this mask ROM, virtual grounding lines 201 and main bit lines 202 are formed alternately, with the direction normal to the extending direction of the word lines as the longitudinal direction. These virtual grounding lines 201 and the main bit lines 202 are wired with a shift of one bit line one so as to be connected to different columns for one and the other of memory cell blocks. Thus the same bit line may be connected to the virtual grounding line 201 or to the main bit line 202 by alternative selection or bank selection of selection transistors 203 and 204. For readout, a given column is selected by column selection transistor 208 and a word line is selected so that data may be read out by means of the main bit line 202 and sense amplifier 209 and transmitted to an output terminal.

In FIG. 2, which shows the layout of the mask ROM shown in FIG. 1, the region indicated by numerous dots indicates polysilicon layers which are arrayed parallel to one another with the X-direction as the longitudinal direction. The region sandwitched between a pair of contact holes 211, 211 in the Y-direction represents a memory block. A diffusion region 213 where the contact hole 211 is formed is roughly of a pattern in the form of a letter H. Diffusion regions 205 to 207, ... indicate bit lines functioning as the source-drain region. The channel of the transistor of each cell is formed in the lower portions of the word lines $W_1$ to $W_8$. Programming in performed by introducing impurities into the channel with the use of a mask pattern 212. Gate electrodes $SO_i$, $SO_{i+1}$ of a selection transistor 204 and gate electrodes $SE_i$, $SE_{i+1}$ of a selection transistor 203 used for bank selection are extended parallel to the word lines $W_1$ to $W_8$, and are arranged on both sides of the memory block.

With the above described NAND type cell, the memory cell driving capability is lowered when the number of serially connected transistors is increased with a view to achieving a higher degree of integration.

On the other hand, with the NOR type cell mask ROM, the following layout problems are raised.

The transistor channel of each cell is formed at the lower portion of the word lines $W_1$ to $W_8$, with the channel direction being the X-direction. However, with the selection transistors 203, 204 for bank selection, the channel region is formed between the bit lines 205 to 207, ... and the substantially H-shaped diffusion region 213, despite the fact that the gate electrodes $SE_i$, $SE_{i-1}$, $SO_i$ and $SO_{i+1}$ thereof run parallel to word lines $W_1$ to $W_8$. Thus the channel direction of these selection transistors is the Y-direction. Therefore, with the selection transistors 203, 204 for bank selection, the channel stop region need to be formed between the adjoining channels in the lower portions of the gate electrodes $SE_i$, $SE_{i-1}$, $SO_i$ and $SO_{i+1}$. Thus, while it suffices in the memory cell region to perform channel stop ion implantation in alignment with word lines $W_1$ to $W_8$, it is necessary to perform ion implantation separately from that for the memory cell region. Since the channel stop region cannot be formed in alignment with the polysilicon layer, it is necessary to provide a margin to take account of mask deviation. The necessity for providing such a margin results in limitations on the memory block side region and consequent difficulties in improving the degree of integration of the memory device.

OBJECT AND SUMMARY OF THE INVENTION

It is an object of the present invention to provide a read-only memory device in which the memory cell driving capability may be enhanced despite the elevated degree of integration and in which a high degree of integration may be achieved from the viewpoint of layout.

According to the read-only memory device of the present invention, a plurality of cells each including a MIS transistor having a different threshold voltage in accordance with the programmed data are arranged in a matrix configuration to form NOR type cells. The memory device includes word lines functioning as the gates of the MIS transistors and used in common in the cell rows and bit and column lines used as sets in the cell columns and used in common in the cells adjacent to each other in the extending direction of the word lines. The bit lines and the column lines are arrayed alternately in the extending direction of the word lines. Thus, one of the sources or the drains of the MIS transistors arrayed in each cell column is used as the bit line for data read-out while the other of the sources or the drains of the MIS transistors arrayed in each cell column is used as the column line to which a predetermined potential is applied. A plurality of the bit lines and a plurality of the column lines make up a group, and a plurality of such groups are provided in the memory device in its entirety. There are provided first selection means for selecting one of the groups, second selection means for selecting the bit line of the ground and third selection means for selecting the column line of the group.

Since the read-only memory device of the present invention is provided with the NOR type cells, the memory cell driving capability is improved. The bit lines and the column lines may be connected fixedly as a result of the above described arraying of the bit lines and the column lines and the provision of the first to third selection means, so that the second and the third selection means may be arrayed with a sufficient layout margin.

In one aspect of the present invention, MIS transistors are used as the second and the third selection means. With the channel direction of these MIS transistors being the same as the channel direction of the MIS transistors of the cells, a higher degree of integration may be achieved by the aligned formation of the selection means similar to that of the memory cells.

In another aspect, the second and the third selection means are formed in a staggered relation with respect to the memory cells for facilitating the wiring for layout. If necessary, the memory device may be divided into plural memory blocks and, in addition, a load circuit may be provided in the bit or column lines.

With the above described read-only memory device, NOR type memory cells are formed on the semiconductor substrate. With a memory device according to a modification of the present invention an impurity region having an opposite conductivity type to that of the semiconductor substrate is formed below a plurality of parallel thick insulating films formed in striped pattern on the semiconductor substrate. A plurality of electrode layers extending substantially orthogonally to the striped pattern of the insulating films are formed on thin insulating films between the thick striped insulating films. Impurities are selectively introduced into the substrate region below the electrode layers functioning as the gates of the MIS transistors. The electrode layers may be either of a single-layer structure or a double-layer structure.

DETAILED DESCRIPTION OF THE PREFERRED EMBODIMENTS

First Embodiment

The present embodiment is an example of a read-only memory (ROM) device having memory cells arrayed in a matrix, wherein source-drain regions of MOS transistors of the memory cells are bit and column lines which are arranged alternately. Impurities are selectively introduced by ion implantation into channel regions of the MOS transistors of the memory cells for programming the transistors.

Figure 5:
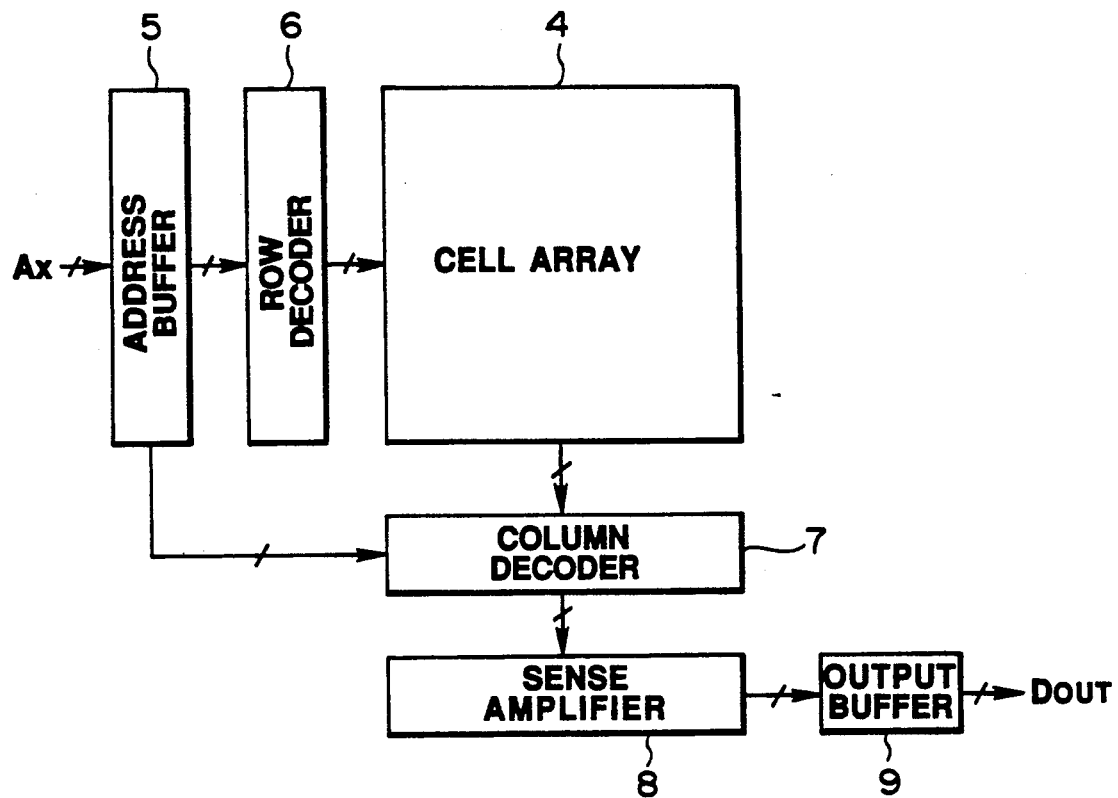
FIG. 5 is a block diagram of the memory device shown in FIG. 3.

Overall General Arrangement (FIG. 5)

The ROM of the present embodiment has an overall general construction as shown in FIG. 5. Thus the ROM has a cell array 4 made up of a large number of memory cells in a matrix configuration and a row decoder 6 and a column decoder 7 for selecting the rows and columns in the cell array 4, respectively. Signals are transmitted via row decoder 6 and column decoder 7 from an address buffer 5. These signals from the address buffer 5 are derived from address signals $A_x$ from outside. Date from the cell array 4 are amplified via column decoder 7 by a sense amplifier 8 so as to be transmitted to an output buffer 9. An output buffer $D_{OUT}$ is taken out to outside from output buffer 9.

Figure 1:
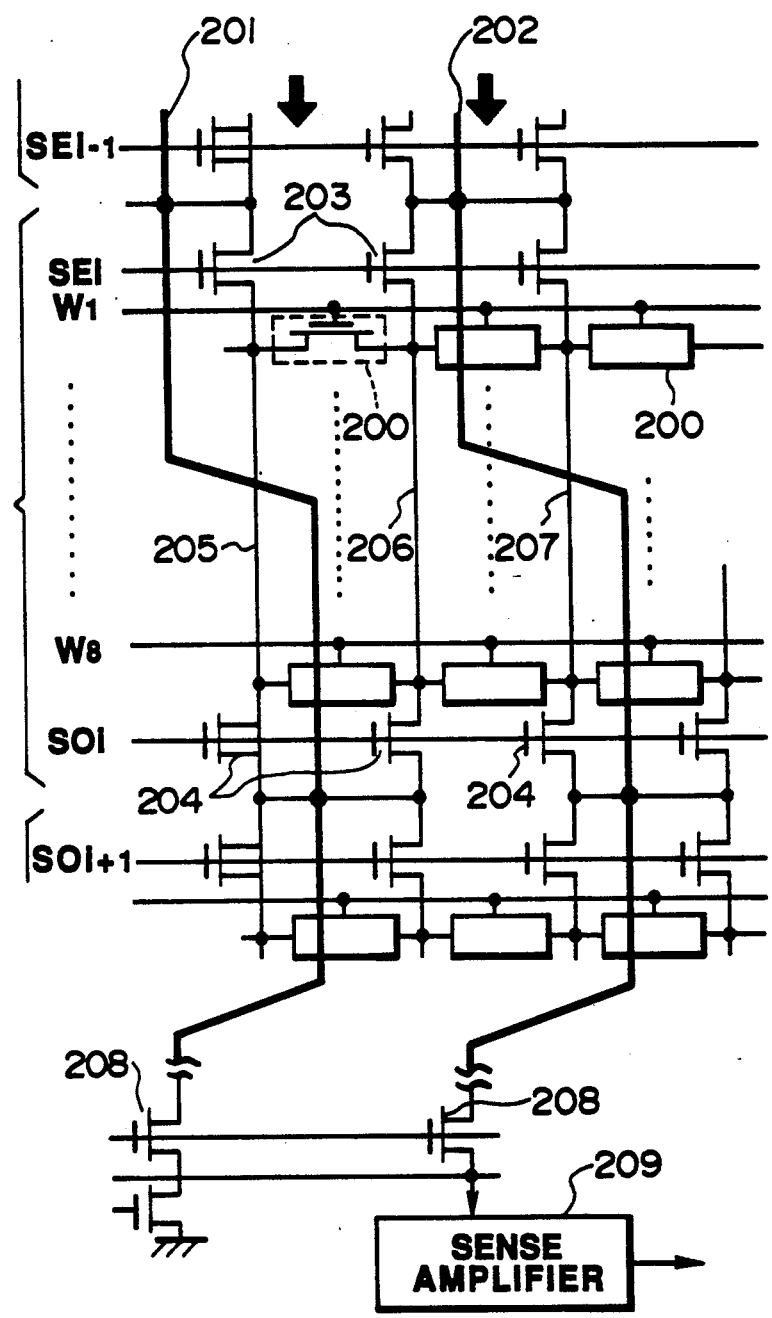
FIG. 1 is a circuit diagram showing essential portion of an example of the conventional read-only memory device.
Figure 2:
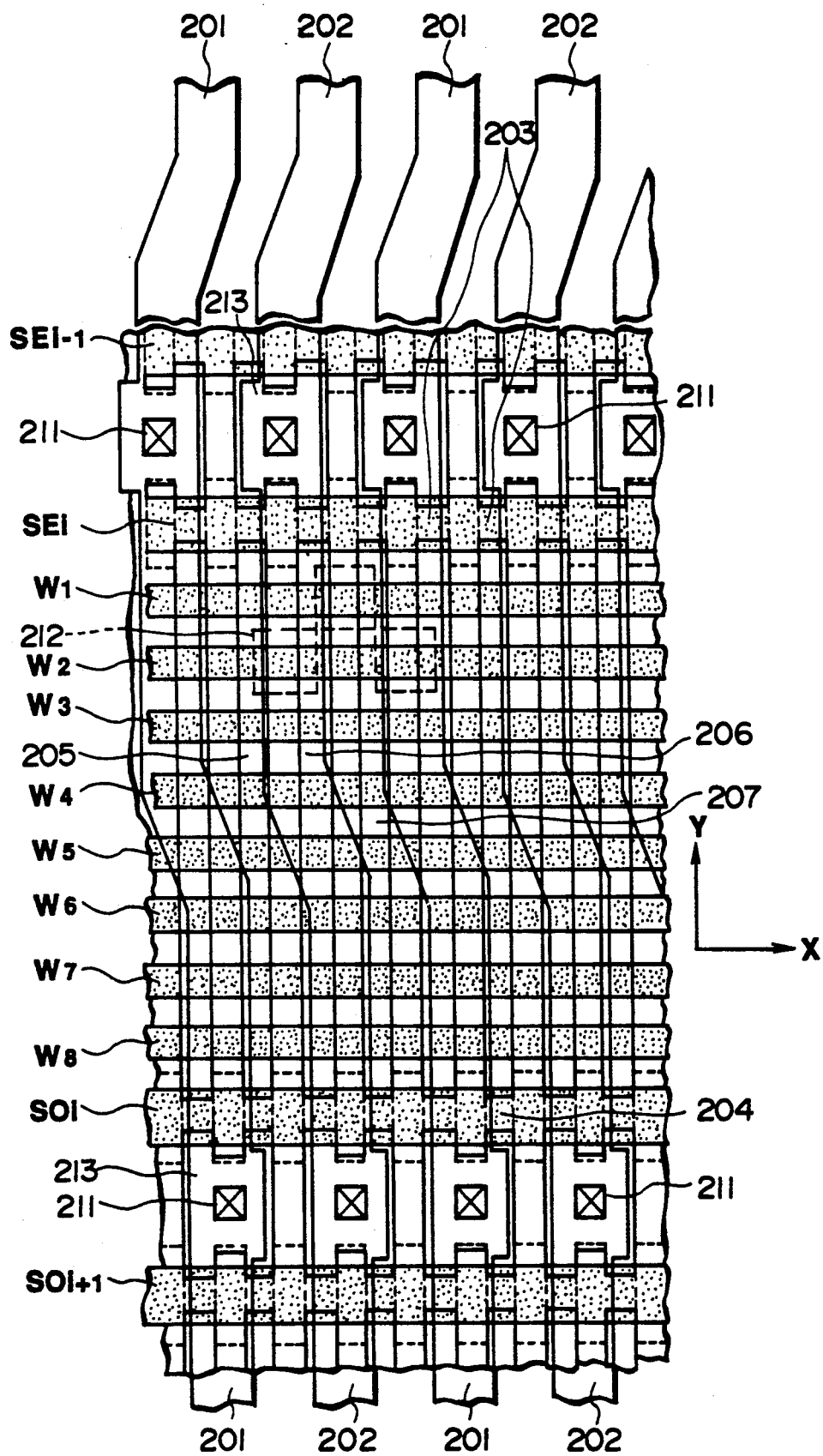
FIG. 2 is a plan view showing the layout thereof.
Figure 3:
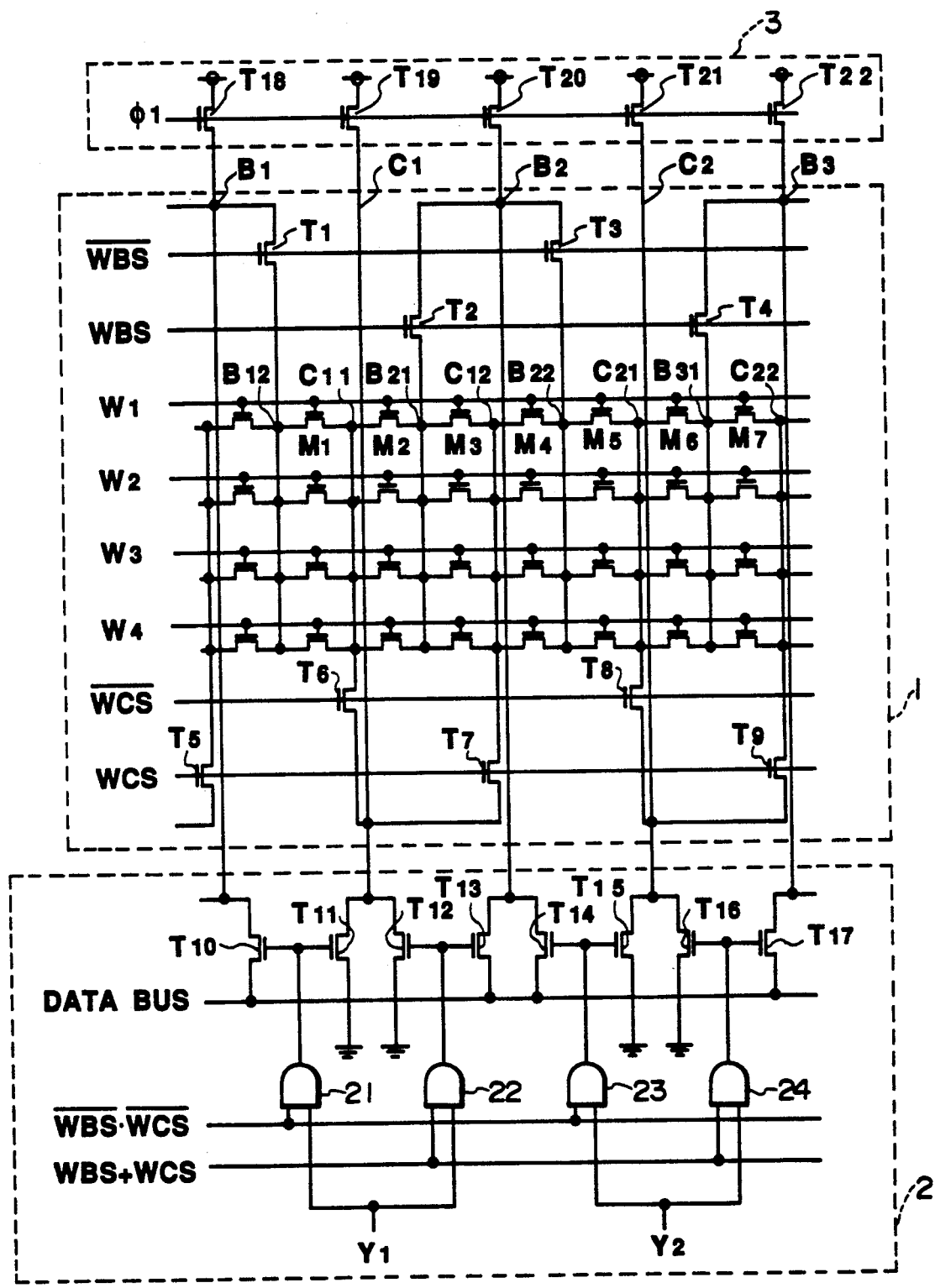
FIG. 3 is a circuit diagram showing essential portions of an embodiment of the read-only memory device of the present invention.

Cell Array Arrangement (FIG. 3)

The arrangement of a cell array section of the ROM of the present embodiment is explained by referring to FIG. 3. Meanwhile, FIG. 3 shows only a portion of a unit structure which is repeated in the extending direction of the word lines. The number of the word lines, which in FIG. 3 is four for convenience sake, is eight or more, as will be explained subsequently.

In each memory cell block 1, memory cells are arrayed in a matrix configuration. Each memory cell is constituted by a n-channel MOS transistor. The threshold value of each MOS transistor is selectively adjusted or programmed to a high threshold voltage or a low threshold voltage as a function of the programmed data. The gate electrodes of these MOS transistors are word lines $W_1$ to $W_4$ which are extended with the horizontal direction in the drawing as the longitudinal direction, and an shared in common by the MOS transistors of each row. One of the source or drain regions of the MOS transistor of each cell is the bit line $B_{12}$, $B_{21}$, $B_{22}$ or $B_{31}$, while the other of the source or drain regions is the column line $C_{11}$, $C_{12}$, $C_{21}$ or $C_{22}$. These bit and column lines are extended with the direction normal to the word lines $W_1$ to $W_4$ as the longitudinal direction. These bit and column lines are shared in common by the MOS transistors lying along the extension of the word lines. Thus the bit lines $B_{12}$, $B_{21}$, $B_{22}$ and $B_{31}$ and the column lines $C_{11}$, $C_{12}$, $C_{21}$ and $C_{22}$ are arrayed alternately along the line of extension of the word lines in such a manner that the bit line $B_{12}$ is followed by the column line $C_{11}$, which is the followed by bit $B_{21}$, and so forth, with the column lines and the word lines being arrayed alternately.

At one end of the memory cell block 1, there are provided MOS transistors $T_1$, $T_2$, $T_3$ and $T_4$ as second selection means for alternatively connecting the bit lines $B_{12}$, $B_{21}$, $B_{22}$ and $B_{31}$ to the main bit lines $B_1$, $B_2$ and $B_3$. That is, the bit line $B_{12}$ is connected via MOS transistor $T_1$ to the main bit line $B_1$, the bit line $B_{21}$ is connected via MOS transistor $T_2$ to the main bit line $B_2$, the bit line $B_{22}$ is connected via MOS transistor $T_3$ to the main bit line $B_2$ and the bit line $B_{31}$ is connected via MOS transistor $T_4$ to the bit line $B_3$. Thus, each main bit line is electrically connected to one of paired bit lines by the MOS transistor as the second selection means. Each of the MOS transistors $T_1$ and $T_3$ has its gate electrode as a selection line $\overline{WBS}$, while each of the MOS transistors $T_2$ and $T_4$ has its gate electrode as a selection line WBS. The signals supplied to the selection line $\overline{WBS}$ and the selection line WBS are in antiphase to each other. Thus, when the selection line WBS is at a high level, the main bit line $B_2$, for example, is connected via MOS transistor $T_2$ to bit line $B_{21}$. Conversely, when the selection line $\overline{WBS}$ is at a high level, the same main bit line $B_2$ is connected via MOS transistor $T_3$ to bit line $B_{22}$. The operation for the other main bit lines is similar to that described above.

At the other end of the memory cell block 1, there are provided MOS transistors $T_5$, $T_6$, $T_7$, $T_8$ and $T_9$ as third selection means. These MOS transistors $T_5$, $T_6$, $T_7$, $T_8$ and $T_9$ are used as switches for electrically connecting the main column lines $C_1$ and $C_2$ to column lines $C_{11}$, $C_{12}$, $C_{21}$ and $C_{22}$. Thus the main column line $C_1$ is connected to column line $C_{11}$ by means of MOS transistor $T_6$, while being connected to column line $C_{12}$ by means of MOS transistor $T_7$. The main column line $C_2$ is connected to column line $C_{21}$ by means of MOS transistor $T_8$, while being connected to column line $C_{22}$ by means of MOS transistor $T_9$. Similar electrical connections are made for the remaining main column lines. Of the MOS transistors, functioning as the third selection means, each of the MOS transistors $T_6$ and $T_8$ has its gate electrode as selection line $\overline{WCS}$, while each of the MOS transistors $T_5$, $T_7$ and $T_9$ has its gate electrode as selection line WCS. The signal supplied to selection line $\overline{WCS}$ is in antiphase with respect to the signal supplied to selection line WCS. Thus, when the selection line $\overline{WCS}$ is at a high level, MOS transistors $T_6$ and $T_8$ are turned on, so that the main column line $C_1$ is electrically connected to the column line $C_{11}$, at the same time that the main column line $C_2$ is electrically connected to the column line $C_{21}$. Conversely, when the selection line WCS is at the high level, MOS transistors $T_7$ and $T_9$ are turned on, so that the main column line $C_1$ is electrically connected to the column line $C_{12}$, at the same time that the main column line $C_2$ is electrically connected to the main column line $C_{22}$.

The main bit lines $B_1$, $B_2$ and $B_3$ and the main column lines $C_1$ and $C_2$, alternatively connected to the bit lines or to the column lines as a function of signals supplied to the selection lines, are extended across the memory cell block 1 in a direction orthogonal to the word line direction. To one ends of the main bit lines $B_1$, $B_2$ and $B_3$ and the main column lines $C_1$ and $C_2$ is connected a load circuit 3 constructed by load transistors $T_{18}$ to $T_{22}$. These load transistors $T_{18}$ to $T_{22}$ are connected to the main bit lines $B_1$ to $B_3$ and to the main column lines $C_1$ and $C_2$, respectively. A source voltage Vcc is applied to these main bit lines $B_1$ to $B_3$ and to main column lines $C_1$ and $C_2$ by way of the associated load transistors $T_{18}$, $T_{19}$, $T_{20}$, $T_{21}$ and $T_{22}$. The gate electrodes of the load transistors $T_{18}$, $T_{19}$, $T_{20}$, $T_{21}$ and $T_{22}$ are connected in common and are supplied with an impedance controlling signal $\phi_1$.

On the side of the memory cell block 1 opposite to the load circuit 3, there is provided a column selection circuit 2 as first selection means. This column selection circuit 2 selects a given row of the memory cell block on the group-by-group basis in dependence upon signals $Y_1$ and $Y_2$ from the column decoder. That is, while the main column line is selected by the signals $Y_1$ and $Y_2$, it is the operation of the MOS transistors $T_5$, $T_6$, $T_7$, $T_8$ or $T_9$ as third selection means which decides to which column line the selected main column line is to be connected. Also, while the main bit line of the two main bit lines according to the present embodiment is selected by the signal $Y_1$ and $Y_2$, it is the operation of the MOS transistors $T_1$ to $T_4$ as second selection means which decides to which column line the selected main bit line is to be connected. With the column selection circuit 2 of the present embodiment, the main column line is mainly selected by the signals $Y_1$ and $Y_2$, at the same time that the main bit lines associated with the main column lines are selected. However, the main bit line may also be selected by the signals $Y_1$ and $Y_2$. With the present embodiment, each group is constituted by two column lines and three bit lines. When assumed that only the signal $Y_1$ is set to a high level, so that the column associated with the signal $Y_1$, is selected, while the second and third selection means are as yet not in operation, the cells or columns that may possibly be selected are the cells on both sides of the column lines $C_{11}$ and $C_{12}$, such that only the cells within the group may be read out. Alternative selection of the bit and column lines within the group is performed by the second and third selection means.

A more specific construction of the column selection circuit 2 is hereinafter explained. The main bit line $B_1$ is connected to a data bus line by means of a MOS transistor $T_{10}$ and another MOS transistor, not shown. The main bit line $B_2$ is connected to the data bus line by means of MOS transistors $T_{13}$ and $T_{14}$, while the main bit line $B_3$ is connected to the data bus line by means of the MOS transistor $T_{17}$ and another MOS transistor, not shown. The main column line $C_1$ is connected to a grounding line by means of MOS transistors $T_{11}$ and $T_{12}$, while the main column line $C_2$ is connected to a grounding line by means of MOS transistors $T_{15}$ and $T_{16}$. The gates of the MOS transistors $T_{10}$ and $T_{11}$ are connected to an output terminal of an AND circuit 21, the gates of the MOS transistors $T_{12}$ and $T_{13}$ are connected to an output terminal of an AND circuit 22, the gates of the MOS transistors $T_{14}$ and $T_{15}$ are connected to an output terminal of an AND circuit 23 and the gates of the MOS transistors $T_{16}$ and $T_{17}$ are connected to an output terminal of an AND circuit 24. These AND circuits 21 to 24 are two-input gates to one of which the signals $Y_1$ or $Y_2$ are entered. To AND circuit 21 are entered the signal $Y_1$ and a logical product of the signals on selection lines $\overline{WBS}$ and $\overline{WCS}$. To the AND circuit 22 are entered the signal $Y_1$ and a logical product of the signals on selection lines $\overline{WBS}$ and $\overline{WCS}$. To the AND circuit 23 are entered the signal $Y_2$ and a logical product of the signals on selection lines WBS and WCS. To the AND circuit 24 are entered the signal $Y_2$ and a logical sum of the signals on selection lines $\overline{WBS}$ and $\overline{WCS}$. Thus it is only when both the signal on the selection lines WBS and WCS are at high level that the outputs of the AND circuits 21, 23 are at a high level and otherwise it is the outputs of the AND circuits 22, 24 that are at a high level.

Figure 4:
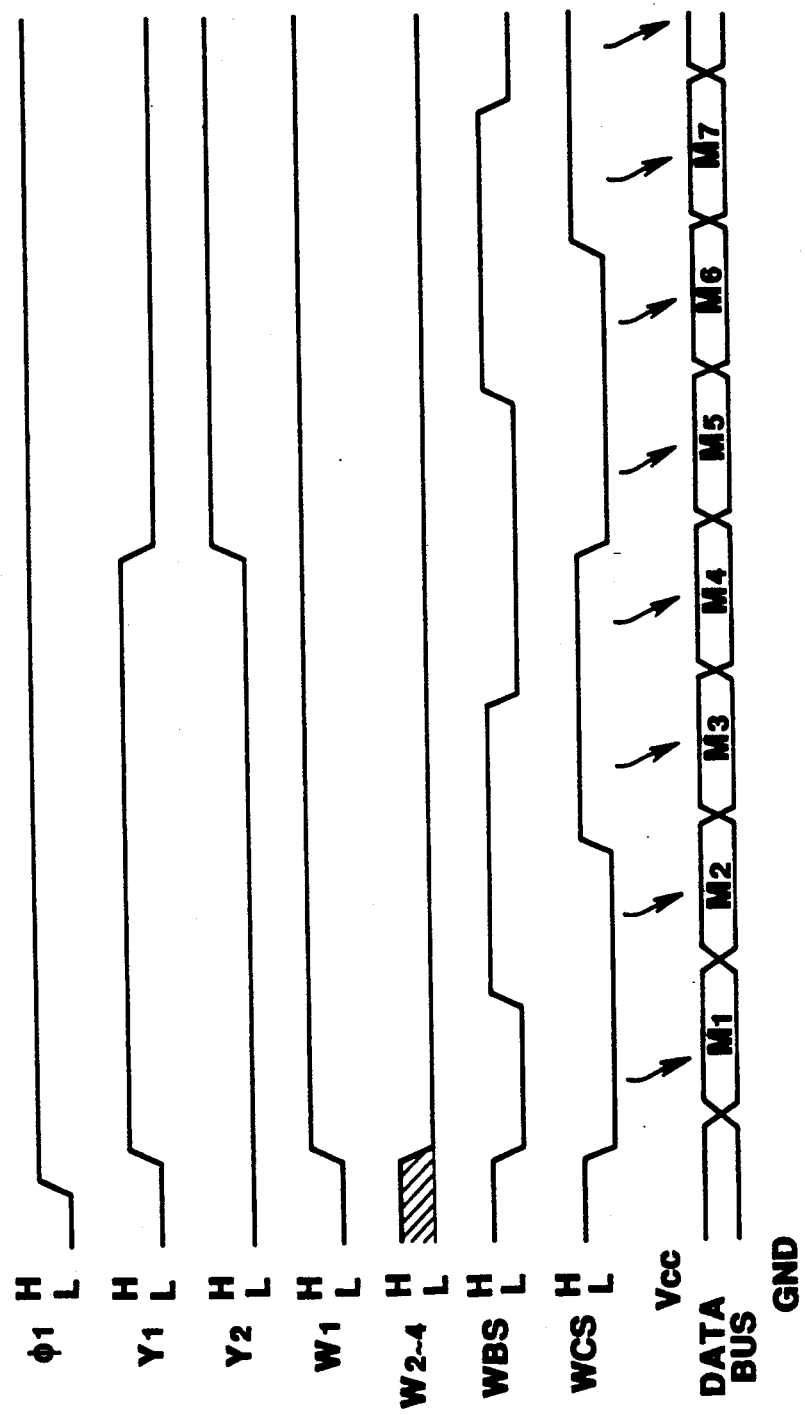
FIG. 4 is a timing chart for illustrating the operation of the memory device shown in FIG. 3.

Description of the Read-out Operation (FIG. 3 and 4)

The read-out operation of a read-only memory of the present embodiment shown in FIG. 3 will be explained by referring to FIG. 4.

Referring to FIG. 4, the signal $\phi_1$ is initially changed from the low (L) level to the high (H) level, the impedances of the load transistors $T_{18}$, $T_{19}$, $T_{20}$, $T_{21}$ and $T_{22}$ of the load circuit 3 are at predetermined levels and the main bit line $B_1$, $B_2$ and $B_3$ and the main column lines $C_1$ and $C_2$ in the non-selected state are raised to the side of the source voltage $V_{cc}$.

The operation will be explained for the case in which the memory transistors $M_1$ to $M_7$ of the first row are read out sequentially. The potential on the word line $W_1$ is raised from the "L" level to the "H" level. This selects the word line $W_1$ of the first row. The potential of the remaining word lines $W_2$ to $W_4$ is at or changed to the "L" level, thus being set to the non-selected state. On the other hand, only the signal $Y_1$ is raised from the "L" level to the "H" level, responsive to the signal from the column decoder, the remain signal, such as the signal $Y_2$, remaining at the "L" level. Thus, only the AND circuits 21 and 22, supplied with the signal $Y_1$, are enabled, while the remaining circuits, such as the remaining AND circuits 23 and 24, are inactivated. With the rising of the signal $Y_1$, signals are supplied on the selection lines WBS and WCS for activating the second and third selection means. The selection line WBS in first set to "L" level, while the selection line WCS is also set to "L" level. Thus the selection lines $\overline{WBS}$, $\overline{WCS}$ are both set to "H" level. As a result, only the output of the AND circuit 21, to which the logical product of the selection line $\overline{WBS}$ and $\overline{WCS}$ is entered, is at "H" level, whereas the outputs of the remaining AND circuits 22 to 24 are at "L" level.

With the AND circuit 21 being at "H" level, the MOS transistors $T_{10}$ and $T_{11}$ are turned on, while the MOS transistors $T_{12}$ to $T_{17}$, driven by the remaining AND circuits 21 to 24, remain in the off state. In this manner, MOS transistors $T_{10}$ and $T_{11}$ are turned on, with the main bit line $B_1$ being electrically connected to the data bus line by means of MOS transistor $T_{10}$. Simultaneously, the main column $C_1$ is electrically connected to the grounding line by means of the MOS transistor $T_{11}$ for functioning as the virtual grounding line. With the main column line $c_1$ being thus connected to the grounding line, the potential at the main column line $C_1$ is lowered.

Simultaneously, since the selection lines $\overline{WBS}$ and $\overline{WCS}$ are both at the "H" level, the MOS transistors $T_1$ and $T_3$ of the second selection means are turned on and the MOS transistors $T_6$ and $T_8$ as the third selection means are turned on. The remaining MOS transistors $T_2$, $T_4$, $T_5$, $T_7$ and $T_9$ of the second and third selection means remain in the off state. Since only the main bit line $B_1$ and the main column $C_1$ are activated, as described above, the main bit line $B_1$ is alternatively connected to the bit line $b_{12}$ by means of the MOS transistor $T_1$, while the main column line $C_1$ is alternatively connected to the column line $C_{11}$ by means of MOS transistor $T_6$. Of the word lines, only the word line $W_1$ is in the on state. Hence, only the memory transistor $M_1$ has been selected at this stage.

When the selected memory transistor $M_1$ has a high threshold voltage by programming by selective impurity ion implantation, memory transistor $M_1$ is not turned on, without the potential at the bit line $B_{12}$ not being lowered. When the memory transistor $M_1$ has a low threshold voltage, the potential at the word line $W_1$ is turned on from the potential word line $W_1$, with the potential at the main bit line $B_1$ being lowered. As a result, the potential at the main bit line $B_1$ is lowered is lowered, with the potential at the data bus line being also lowered. Hence, the potential at the data bus line is changed by the threshold voltage of the memory transistor $M_1$, and the output signal $D_{out}$ may be obtained by detecting and amplifying the potential change on the data bus line by a sense amplifier.

After the data of the transistor $M_1$ is read out, the selection line WBS is changed from "L" level to "H" level. The output of the AND circuit 21 selected to the signal $Y_1$ goes low and, conversely, the output of the AND circuit 22 goes high. As a result, MOS transistor $T_{10}$ is turned off and the main bit line $B_1$ is electrically isolated from data bus line. The main column line $C_1$ is electrically connected to the grounding line by means of the MOS transistor $T_{12}$ instead of being connected via MOS transistor $T_{11}$ to the grounding line. The MOS transistor $T_{13}$ is turned on and the main bit line $b_2$ is now connected electrically to the data bus line by means of MOS transistor $T_{13}$. Since the selection line WCS remains at the "L" level, the main column line $C_1$ is connected to column line $C_{11}$ by means of MOS transistor $T_6$. Since the selection line WBS is switched from "L" level to "H" level, MOS transistor $T_2$ is turned on, while MOS transistor $T_3$ remains off. Thus the main bit line $B_2$ is alternatively connected to bit line $B_{21}$ by means of MOS transistor $T_2$. With the bit line $B_{21}$ and the column line $C_{11}$ selected in this manner, the memory transistor $M_2$ of the row pertaining to the same word line $W_1$ has been selected. The bit line $B_{21}$ is changed in accordance with programmed data similarly to the memory transistor $M_1$ and such change is demonstrated on the data bus line by way of main bit line $B_2$.

During the next cycle, in order to selecting the memory transistor $M_3$, the potential at the selection line WCS is switched from "L" level to "H" level. The MOS transistor $T_6$ connected to the main bit line $C_1$ is turned off, while the MOS transistor $T_7$ is turned on, with the output of the AND circuit 22 remaining at the "H" level. As a result, the column line connected electrically to the main column line $C_1$ is changed from column line $C_{11}$ to column line $C_{12}$, thus the memory transistor $M_3$ being now selected. The bit line $B_{21}$ is changed in accordance with programmed data similarly to the memory transistor $M_1$ and such change is demonstrated on the data bus line by way of main bit line $B_2$.

During the next cycle, the potential at the selection line WBS is lowered from "H" level to "L" level. As a result, MOS transistor $T_2$ is turned off, while MOS transistor $T_3$ is turned on. The bit line connected electrically to main bit line $B_2$ is switched to bit line $B_{22}$. The main column line $C_1$ is already grounded and electrically connected by MOS transistor $T_7$ to column line $C_{12}$, so that memory transistor $M_4$ sandwitched between the column line $c_{12}$ and the bit line $B_{22}$ is elected Similarly, data are read into data bus line by way of main bit line $B_2$.

After reading out the data of memory transistor $M_4$, signal $Y_1$ rises, while signal $Y_2$ falls, as shown in FIG. 4 so that the column selection circuit 2 as the first selection means has selected the next group. With the potentials at the selection lines $\overline{WBS}$ and $\overline{WCS}$ both set to "L" level, the potentials at signal lines WBS and WCS are at "H" level, so that the output of and AND circuit 23 is at "H" level. At this time, the outputs of the remaining AND circuits 21, 22 and 24 are at "L" level. With the output of the AND circuit 23 at the "H" level, MOS transistors $T_{14}$ and $T_{15}$ are turned on, as a result of which the main bit line $B_2$ and the main column line $C_2$ have been selected. Since the potential at the signal line $\overline{WBS}$ is at "H" level, MOS transistor $T_3$ is also selected, such that the main signal line $B_2$ is connected to bit line $B_{22}$ by way of MOS transistor $T_3$. On the other hand, since the potential at signal line $\overline{WCS}$ is at "H" level, MOS transistor $T_8$ is turned on, such that column line $C_{21}$ is electrically connected to main column line $C_2$. With the column line $C_{21}$ and the bit line $B_{22}$ being in use, memory transistor $M_5$ has been selected.

Then, with only the signal $Y_2$ remaining at "H" level, the potentials at the selection lines WBS and WCS are changed sequentially, in the same way as when the signal $Y_1$ is at "H" level, so that the memory transistors $M_6$, $M_7$ and so forth are selected sequentially. After termination of the cycle of the signal $Y_2$, the group-selecting signals $Y_3$, $Y_4$, ... proceed sequentially. When the last column is reached, the potential at word line $W_1$ is lowered, while the potential at word line $W_2$ is raised. The memory transistors are selected similarly sequentially to read out data into the data bus line.

Figure 6:
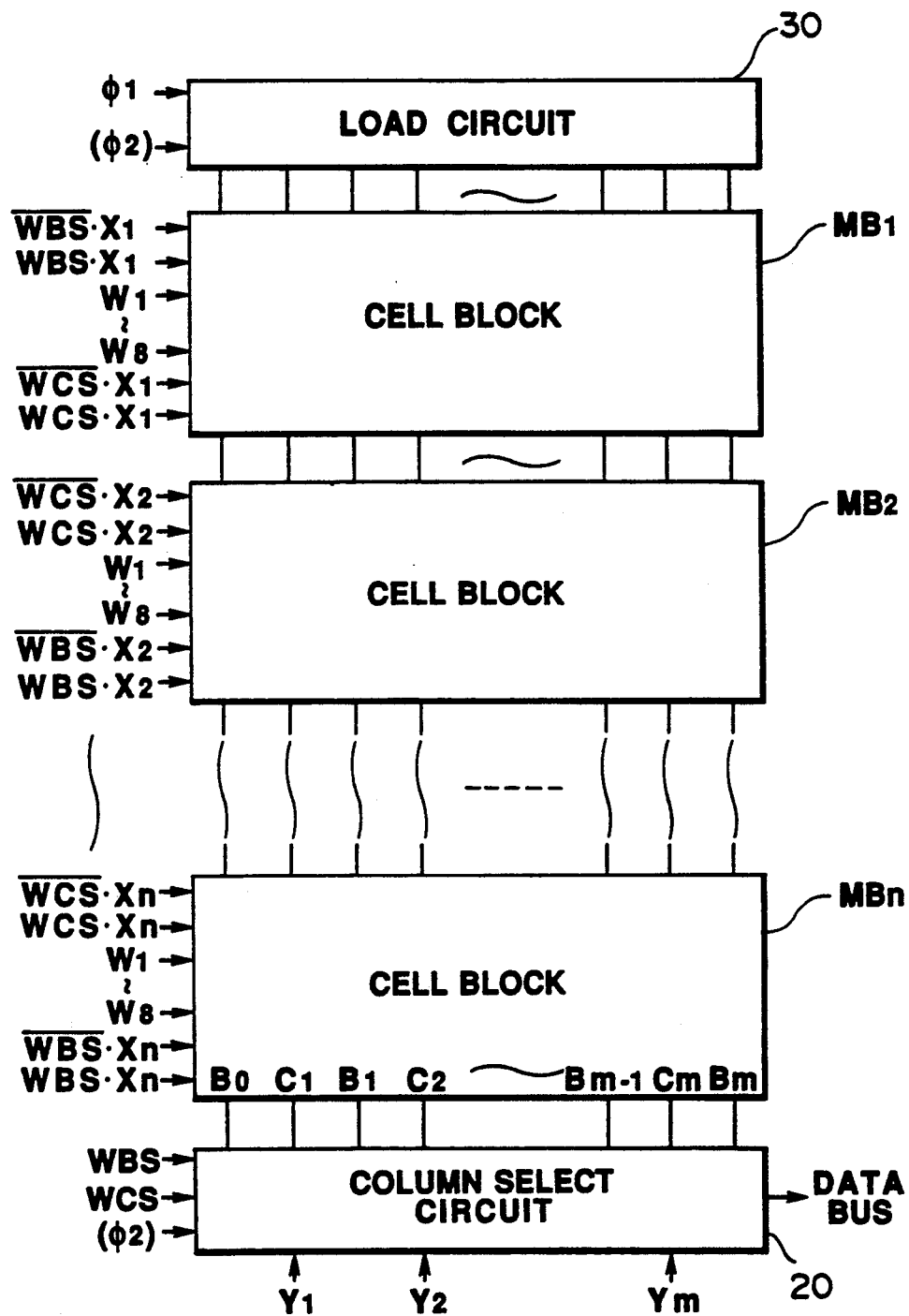
FIG. 6 is a block diagram showing the memory device of FIG. 3 when divided into a plurality of memory blocks.

Divided Memory Construction (FIG. 6)

The ROM of the present embodiment may be divided into memory cell blocks as shown in FIG. 6. Although eight word lines are herein employed, there is not basic difference from the ROM of FIG. 3.

The ROM shown in FIG. 6 has an n number of cell blocks $MB_1$, $MB_2$, ..., $MB_n$ in a direction normal to the extending direction of the word lines. Each cell block $MB_1$, $MB_2$, ..., $MB_n$ has a number of lines employed permanently as alternate column lines and bit lines, and a number of memory transistors arrayed in a matrix configuration. Thus there are provided MOS transistors as second control means, which are controlled by selection lines $BS \cdot X_1$ to $WBS \cdot X_n$, $\overline{WBS} \cdot X_1$ to $\overline{WBS} \cdot X_n$, and MOS transistors, as third selection means, which are controlled by selection lines $WCS \cdot X_1$ to $WCS \cdot X_n$, $\overline{WCS} \cdot X_1$ to $\overline{WCS} \cdot X_n$. With the memory device thus divided into memory cell blocks, the column and bit lines, not shown, in the cell blocks $MB_1$, $MB_2$, ..., $MB_n$, are shortened in length in a direction normal to the extending direction of the work lines. This reduces the values of the resistance or parasitic capacitances to enable a high speed operation, while providing an advantage when the bit lines and the column lines are formed as diffusion regions.

With the above described n number of the cell blocks $MB_1$, $MB_2$, ..., $MB_n$, bit lines $B_0$ to $B_m$ are provided in common and are formed in the same direction as that in which the bit lines are formed. With the n number of the cell blocks $MB_1$, $MB_2$, ... $MB_n$, the main column lines $C_1$ to $C_m$ are provided and arrayed parallel to the main bit line. The main bit lines $B_0$ to $B_m$ and the main column lines $C_1$ to $C_m$ are arrayed alternately in the extending direction of the word lines.

A load circuit 30 is provided at the end of the cell block $MB_1$ in the direction normal to the extending direction of the cell block $MB_1$. To this load circuit 30 is supplied a signal $\phi_1$ for controlling the impedance of the MOS transistor constituting the load circuit 30. Besides this signal $\phi_1$, a signal $\phi_2$ may also be provided, as in an embodiment which will be explained subsequently. With the main bit lines $B_0$ to $B_m$ and the main column lines $C_1$ to $C_m$ thus used in common in each of the cell blocks $MB_1$, $MB_2$, ..., $MB_n$, the load circuit 30 may be arranged at the end of the cell blocks in their entirety for realizing the reduced area occupied by memory cells and the high degree of integration of the memory device.

A column selection circuit 20 is provided at the end of the cell block $MB_n$ in a direction normal to the extending direction of the word lines. Control signals WBS, WCS as well as column selection signals $Y_1$ to $Y_m$ from column decoder are supplied to the column selection circuit 20. By these signals, each one main column line and main bit line are selected as a group to perform the above described read-out operation. With the main bit lines $B_0$ to $B_m$ and the main column lines $C_1$ to $C_m$ thus used in common in the cell blocks $MB_1$, $MB_2$, ..., $MB_n$, the column selection circuit 20 may be arrayed at the terminal end of the cell blocks in their entirety, as in the case of the load circuit 30, for realizing reduction in the area occupied by memory cells and the high degree of integration of the memory device.

Figure 7:
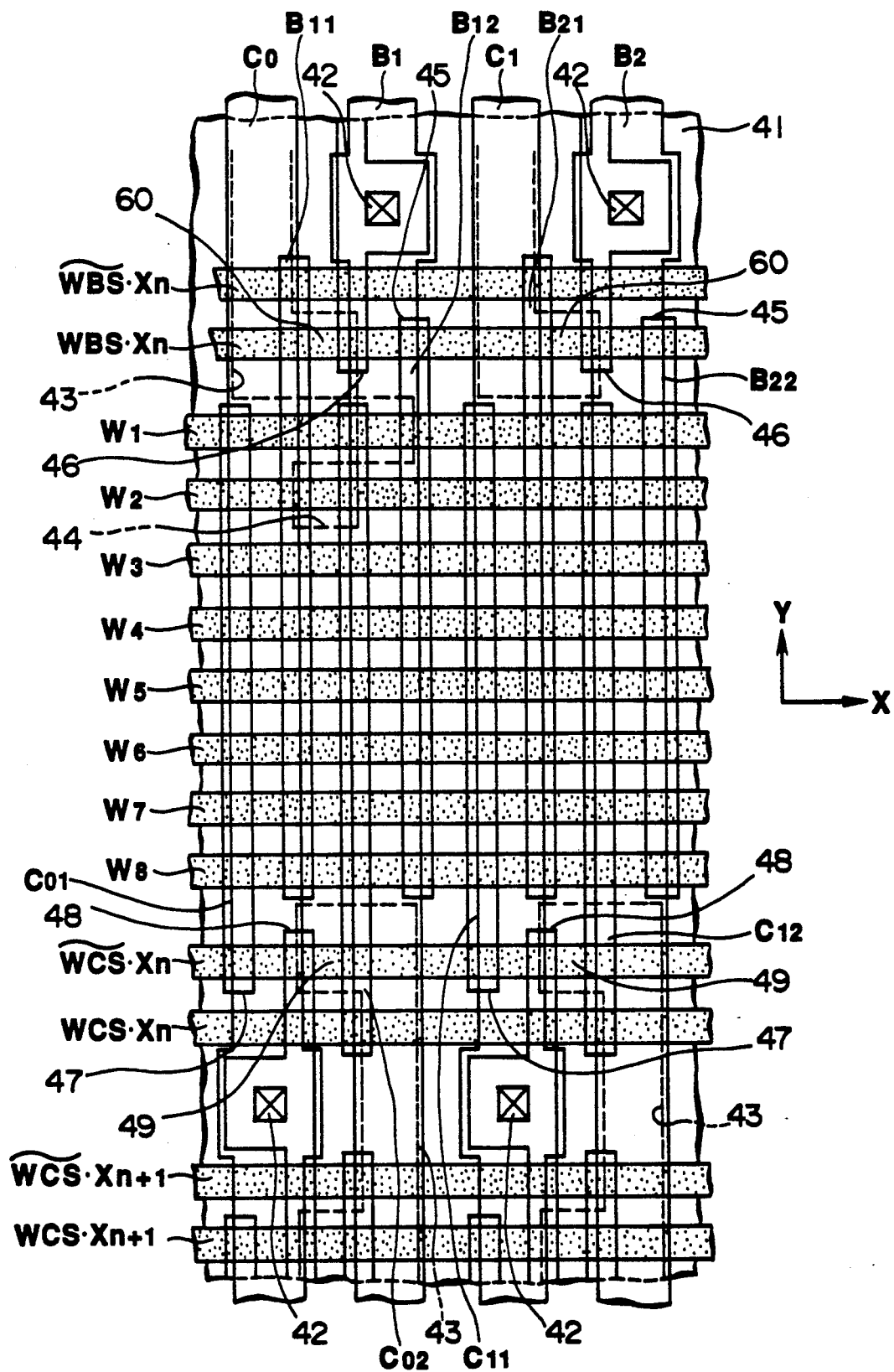
FIG. 7 is a plan view showing the layout of the memory device shown in FIG. 3, wherein the electrode layer is formed by a single-layer polysilicon layer.

Layout for the Case the Electrode Layer is a single Polysilicon Layer (FIG. 7)

Then, referring to FIG. 7, the layout for the case in which the electrode layer is formed as a single polysilicon layer is explained. Meanwhile, the layout of FIG. 5 is a partial view for simplifying the description. In practice, the layout is a continuous repetition of the pattern shown therein in the X- and Y-directions.

As shown in FIG. 7, a plurality of polysilicon layers shown by dotted areas are formed on the silicon substrate 41 for extending in the X-direction. In this layout, the area between a pair of contact holes 42, 42 arrayed in the Y-direction represents one cell unit within which selection lines $\overline{WBS} \cdot X_n$ and $\overline{WCS} \cdot X_n$, eight word lines $W_1$ to $W_8$ and selection lines $WCS \cdot X_n$ and $WCS \cdot X_n$ are formed as bands or stripes each formed by a polysilicon layer. These lines are spaced apart from each other by a predetermined distance and ion implantation is performed in a self-aligned manner to form channel stop regions.

The patterns of bit lines $B_{11}$, $B_{12}$, $B_{21}$ and $B_{22}$ and column lines $C_{01}$, $C_{02}$, $C_{11}$ and $C_{12}$ are formed with the Y-direction as the longitudinal direction, as shown by solid lines in the drawings. These bit lines $B_{11}$, $B_{12}$, $B_{21}$ and $B_{22}$ and the column lines $C_{01}$, $C_{02}$, $C_{11}$ and $C_{12}$ are of the striped patterns and are constituted by impurity diffusion regions formed at the bottom of the thick oxide film (LOCOS). The thick oxide film is not shown in the drawing. These bit lines $B_{11}$, $B_{12}$, $B_{21}$ and $B_{22}$ and the column lines $C_{01}$, $C_{02}$, $C_{11}$ and $C_{12}$ are formed by impurity diffusion regions formed at the lower side of the thick oxide film on the surface of the silicon substrate 41 and hence are used as the source and drain regions of the memory transistors. These bit lines $B_{11}$, $B_{12}$, $B_{21}$ and $B_{22}$ and the column lines $C_{01}$, $C_{02}$, $C_{11}$ and $C_{12}$ have characteristic terminal positions in the cell block in order that the MOS transistors and the memory transistors functioning as the second and third selection means may be in the same channel direction.

That is, the column lines $C_{01}$, $C_{11}$ are formed from the lower end of the word line $W_1$ as far as the lower end of the selection line $WCS \cdot X_n$, while the end 47 of the third selection means does not reach the lower end of the selection line $WCS \cdot X_n$. Thus the perimeter of the contact hole 42 may be extended to an extended position on the column lines $C_{01}$ and $C_{11}$. The column lines $C_{02}$ and $C_{12}$ are formed in a range extending from the lower end of the word line $W_1$ to the lower end of the selection line $WCS \cdot X_n$. The impurity diffusion region extending from contact hole 42 with the main column lines $C_0$ and $C_1$ is extended in the Y-direction on a line of extension of the bit line and has a terminal point 48 extending from the contact hole 42 beyond the selection line $W\widetilde{C}S \cdot X_n$. Into a region 49 between the column lines $C_{02}$ and $C_{12}$ and the impurity diffusion region at the lower end of the selection line $W\widetilde{C}S \cdot X_n$ extending from the contact hole 42 are implanted channel formation inhibiting impurities with the use of a mask pattern 43 shown by a broken line in FIG. 7. Thus the selection transistor for the column lines $C_{01}$ and $C_{11}$ is the MOS transistor formed in the selection lines $W\widetilde{C}S \cdot X_n$, whereas the selection transistor for the column lines $C_{02}$ and $C_{12}$ is the MOS transistor formed in the selection lines $WCS \cdot X_n$. Since the channel direction of these MOS transistors formed in the selection lines $W\widetilde{C}S \cdot X_n$ and $WCS \cdot X_n$ is the same as the channel direction of the memory transistors, channel stop regions may be easily formed in a self-aligned manner as in the case of the word lines $W_1$ to $W_8$ to reduce the area occupied by memory cells or to achieve a higher degree of integration of the memory device.

The bit lines are also formed so that the channel direction of the selection transistors in the X-direction. Thus the bit lines $B_{12}$ and $B_{22}$ are formed from the lower end of the word line $W_8$ as far as the lower end of the selection line $WBS \cdot X_n$, while the terminal end 45 of the second selection means does not reach the lower end of the selection line $W\widetilde{B}S \cdot X_n$. Thus the perimetral portion of the contact hole 42 may be extended on the line of extensions of the bit lines $B_{12}$ and $B_{22}$. On the other hand, the bit lines $B_{11}$ and $B_{21}$ are formed in the range extending from the lower end of the word line $W_8$ as far as the lower end of the selection line $WBS \cdot X_n$, such that the selection line $W\widetilde{B}S \cdot X_n$ towards the contact hole 42 may be used as the gate of the selection MOS transistor. The region 60 between the bit lines $B_{11}$, $B_{12}$ and the impurity diffusion region extended from the contact hole 42 connecting to main bit lines $B_1$, $B_2$ is formed as a channel stop region with the use of the mask pattern 43. The impurity diffusion region is extended in the Y-direction on the lines of extension of the column lines $C_{02}$ and $C_{12}$ and has its terminal portion 46 lying across the two selection lines $W\widetilde{B}S \cdot X_n$ and $WBS \cdot X_n$. Thus the main bit lines $B_1$ and $B_2$ are alternatively connected to the bit lines, such that these main bit lines are connected via selection line $W\widetilde{B}S \cdot X_n$ to bit lines $B_{11}$ and $B_{21}$, while being connected via selection line $WBS \cdot X_n$ to bit lines $B_{12}$ and $B_{22}$. As in the column lines, the channel direction is the same as the direction of the word lines $W_1$ to $W_8$, which is advantageous for reducing the area occupied by the memory cells.

The mask pattern 43 may be used simultaneously as mask 44 for programmed ion implantation which is designed for inhibiting channel formation in each memory transistor. This result in a more simplified operating process and reduced turn around time (TAT).

The main bit lines $B_1$ and $B_2$ are aluminum wiring layers extended in the Y-direction. The main column lines $C_0$ and $C_1$ are similarly aluminum wiring layers also extended in the Y-direction. These main bit lines $B_1$ and $B_2$ and the main column lines $C_0$ and $C_1$ are of a striped pattern and extended parallel to each other so as to connect to the impurity diffusion region formed on the surface of the silicon substrate 41 in the region of the contact hole 42. With the read-only memory of the present embodiment, the contact hole 42 for the main bit lines $B_1$ and $B_2$ and the contact hole 42 for the main column lines $C_0$ and $C_1$ are formed in a staggered relation in the Y-direction of the cell block. Thus the contact holes 42 are not adjacent to each other in the X-direction, which is advantageous for circuit integration.

Figure 8:
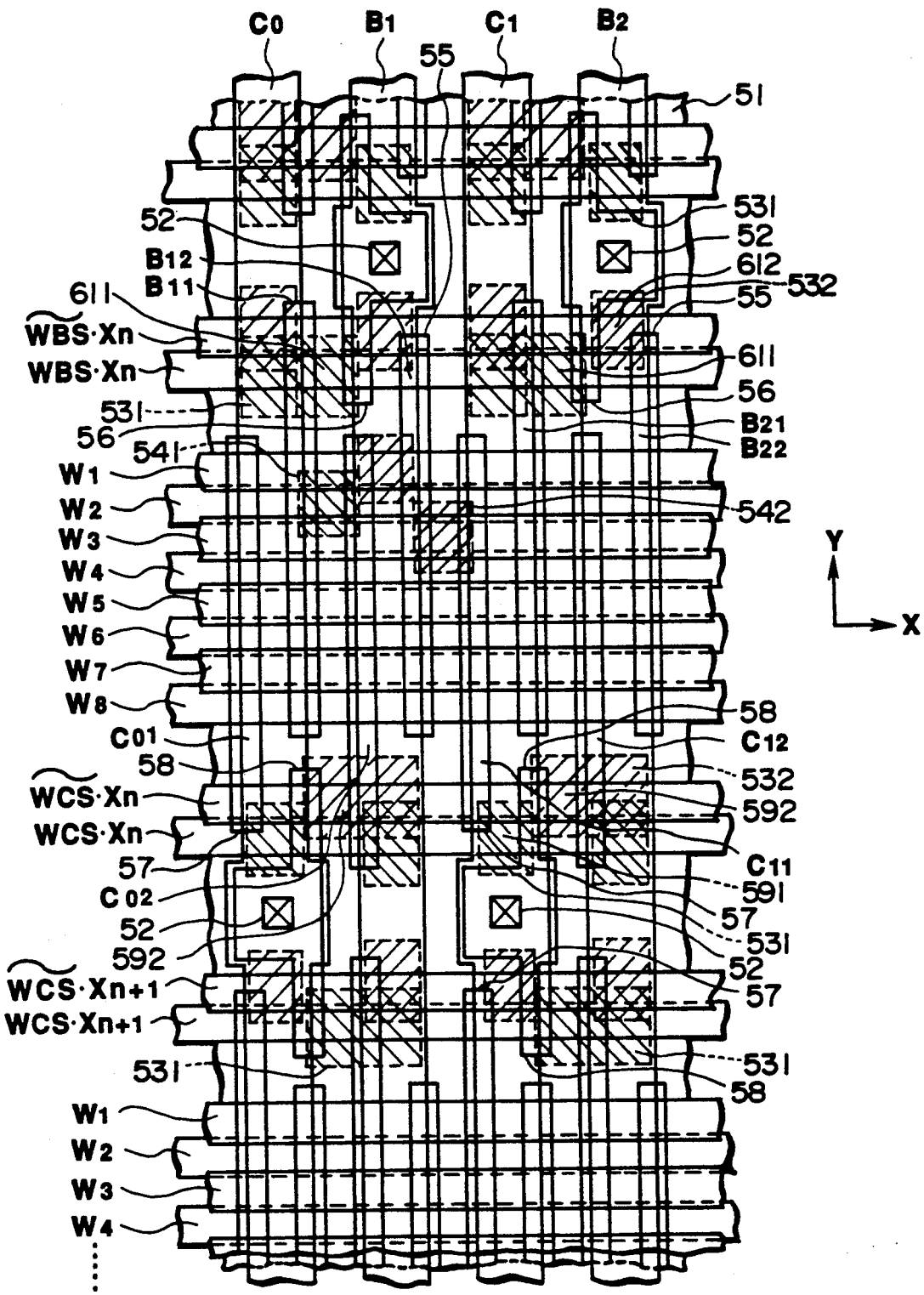
FIG. 8 is a plan view similar to FIG. 7 wherein the electrode layer is formed by a double-layer polysilicon layer.

Layout for the Case in which the Electrode Layer is formed as two polysilicon layers (FIG. 8)

Referring now to FIG. 8, the layout for the case in which the electrode layer is formed as the two polysilicon layers, is explained. Meanwhile, the layout shown in FIG. 8 is a continuous repetition of the pattern shown therein in the Y- and X-direction, as in the case of FIG. 7.

The ROM of the present embodiment, having these two polysilicon layers as the electrode layers, is of a striped pattern in which, as shown in FIG. 8, the first polysilicon electrode layer and a second polysilicon electrode layer are formed on a silicon substrate 51 in the X-direction. The selection lines $WBS \cdot X_n$, $WCS \cdot X_n$ and $WCS \cdot X_{n+1}$ and the word lines $W_2$, $W_4$, $W_6$ and $W_8$ are formed from the first polysilicon layer, while the selection line $W\widetilde{B}S \cdot X_n$, $W\widetilde{C}S \cdot X_n$ and $W\widetilde{C}S \cdot X_{n+1}$ and the word lines $W_1$, $W_3$, $W_5$ and $W_7$ are formed from the second polysilicon layer. The horizontal distance between the first and second polysilicon layers, functioning as the selection lines, is that formed solely by the thin interlayer insulating film, such that the polysilicon layers are arrayed with an interstice therebetween which is so narrow that the terminal portions thereof in the Y-direction overlap with each other. The word lines $W_1$ to $W_8$ is arrayed with a narrow interstice in the Y-direction by taking advantage of the properties of the two polysilicon layers. Ion implantation for transistor programming is performed for these word lines $W_1$ to $W_8$ using mask patterns 541 and 542. This ion implantation may be performed in self alignment which is effective for reducing the area. The arrangement of the word lines in explained subsequently. It is noted that the selection lines may be formed by single polysilicon layers arrayed side by side instead of the two-layered structure.

Each cell block is arranged in a region defined between contact holes 52, 52 as viewed in the Y-direction. Since the two polysilicon layers are used as described above, the cell block width along the Y-direction is shorter than in the case of the single layer construction.

Within the cell block, bit lines $B_{11}$, $B_{12}$, $B_{21}$ and $B_{22}$ and column lines are formed in striped pattern parallel to one another with the Y-direction as the longitudinal direction. The patterns of these bit lines $B_{11}$, $B_{12}$, $B_{21}$ and $B_{22}$ and the column lines $C_{01}$, $C_{02}$, $C_{11}$ and $C_{12}$ are formed by impurity diffusion regions formed at the lower end of the thick oxide film (LOCOS). This thick oxide film is not shown in the drawing. The bit lines $B_{11}$, $B_{12}$, $B_{21}$ and $B_{22}$ and the column lines $C_{01}$, $C_{02}$, $C_{11}$ and $C_{12}$ function as the source and drain regions of the memory transistors. The channel direction of the memory transistors of these bit lines $B_{11}$, $B_{12}$, $B_{21}$ and $B_{22}$ and the column lines $C_{01}$, $C_{02}$, $C_{11}$ and $C_{12}$ is the same as that of the MOS transistors functioning as the second and third selection means.

The column lines $C_{01}$, $C_{02}$, $C_{11}$ and $C_{12}$ are formed by patterns beginning at the lower end of the word line $W_1$. The terminal ends 57 of the column lines $C_{01}$ and $C_{11}$ extend to the lower end of the selection line $\overline{WCS}\cdot X_n$, whereas the column lines $C_{02}$ and $C_{12}$ extend to the lowers end of the selection line $WCS\cdot X_n$. The impurity diffusion region, connecting to the contact hole 52, is extended over the selection line in the Y-direction on the line of extension of the bit line for functioning as one source drain region of the MOS transistor. Thus the selection transistor of the column lines $C_{01}$, $C_{11}$ is the MOS transistor formed on the selection line $\overline{WCS}\cdot X_n$, whereas the selection transistor of the column lines $C_{02}$ and $C_{12}$ is the MOS transistor formed on the selection line $WCS\cdot X_n$. For forming these selection transistors, ion implanation for inhibiting channel formation is performed into regions 591 and 592 using mask patterns 531 and 532. These mask patterns may be formed by the same process as used for programming for the lower portions of the first and second polysilicon layers. Since the channel direction of the MOS transistor formed in each of these selection lines $WCS\cdot X_n$ and $\overline{WCS}\cdot X_n$ is the same as that of the memory transistor, channel stop regions can be easily formed in a self-alignment manner, as in the case of the word lines $W_1$ to $W_8$, with a marked advantage in reduction of the area occupied by the cells or higher integration of the memory device.

While the pattern of the bit lines $B_{11}$, $B_{12}$, $B_{22}$ and $B_{21}$ starts at the lower end of the word line $w_8$, the terminal ends of the bit lines $B_{12}$ and $B_{22}$ are at the lower end of the selection line $WBS\cdot X_n$ and the bit lines $B_{11}$ and $B_{21}$ are formed as far as the lower end of the selection line $\overline{WBS}\cdot X_n$. With such pattern, the MOS transistor having the channel direction in the X-direction is formed in each of the selection lines $WBS\cdot X_n$ and $\overline{WBS}\cdot X_n$, in a manner advantageous for reducing the occupied area. Thus, on the bit line side, the regions 611 and 612 between the bit lines $B_{12}$, $B_{22}$ and the impurity diffusion regions may be formed as the channel stop regions with the use of the mask patterns 531 and 532 which are used during programming.

The main bit lines $B_1$ and $B_2$ and the main column lines $C_0$ and $C_1$ are aluminum wiring layers extended in the Y-direction in the drawing. The main bit lines $B_1$ and $B_2$ and the main column lines $C_0$ and $C_1$ are formed as striped patterns running parallel to each other, in a manner advantageous for reducing the circuit size. These main bit lines $B_1$ and $B_2$ and the main column lines $C_0$ and $C_1$ connect to the impurity diffusion region for formed on the surface of the silicon substrate 41 near the contact hole 52. With the read-only memory device of the present embodiment, the contact holes 52 for the main bit lines $B_1$ and $B_2$ and the main column lines $C_0$ and $C_1$ are formed in a staggered relation in the Y-direction of the cell block, so that the contact holes 52 are not arrayed in an adjacent relation in the X-direction with an advantage for circuit integration.

Cell Structure (FIGS. 9 to 13)

The structure of the memory cell is explained by referring to FIGS. 9 to 13.

Figure 9:
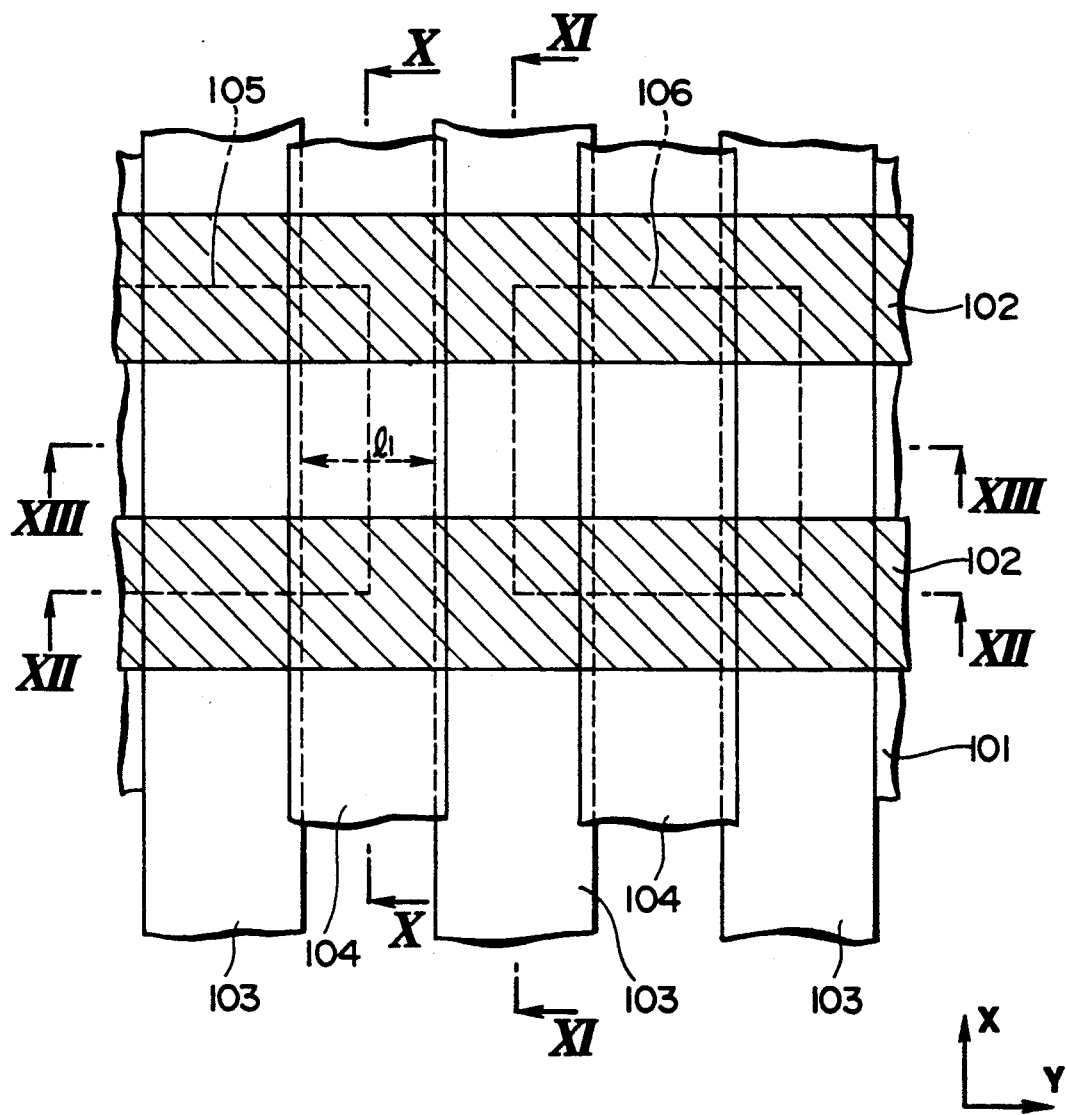
FIG. 9 is a plan view showing the memory cell layout of the memory device shown in FIG. 3.

FIG. 9 is a plan view showing a cell of the ROM of the present embodiment having the two polysilicon layer structure. The hatched line regions indicate thick oxide films formed on the surface of a p-type semiconductor substrate 101. These oxide films are each of a striped pattern and are extended in the Y-direction parallel to each other. Source-drain regions 107 are formed in an aligned manner below the thick oxide film 102. First polysilicon layers 103 as the first electrode layers and second polysilicon layers 104 as the second electrode layers are formed as parallel striped pattern extending in the x-direction which runs at right angles with the thick oxide films 102. The first polysilicon layers 103 are formed by parallel stripped patterns and have an interval of a width $l_1$ between the adjacent patterns. The second polysilicon layers 104 are formed to overlie the edges of the first polysilicon layers 103 with the edges of the second layers 104 in the Y-direction overlapping with the edges of the first layers 103. Thus the memory transistors are formed in a side-by-side relation in the Y-direction without any interstices therebetween for realizing the higher degree of integration of the read-only memory device. A substantially square pattern 105 represents a window of a program mask by ion implantation into the lower portion of the first polysilicon layer 103, whereas a substantially square pattern 106 represents a window of a program mask by ion implantation into the lower portion of the second polysilicon layer 104. These patterns 105 and 106 larger openings, being larger in width than the layers 103, 104 in the Y-direction and bridging a pair of the thick oxide film 102, 102 in the X-direction. During the ion implantation with the aid of the pattern 105, a pair of the thick oxide films 102, 102 function as a part of the mask along with a resist mask. Excess portions in the Y-direction may be etched off by aligned etching with the first polysilicon layer to cope with the problem of mask shifting. During ion implantation with the aid of the pattern 106, a pair of the pair of thick oxide films 102, 102 and the first polysilicon layer 103 function as the mask, along with the resist mask, to cope with the problem of mask shifting. Hence, a positive programming may be achieved despite increased circuit integration.

Figure 10:
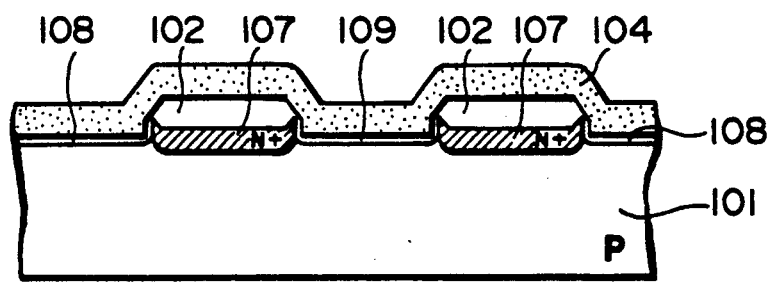
FIG. 10 is a cross-sectional view taken along line X—X of FIG. 9.
Figure 11:
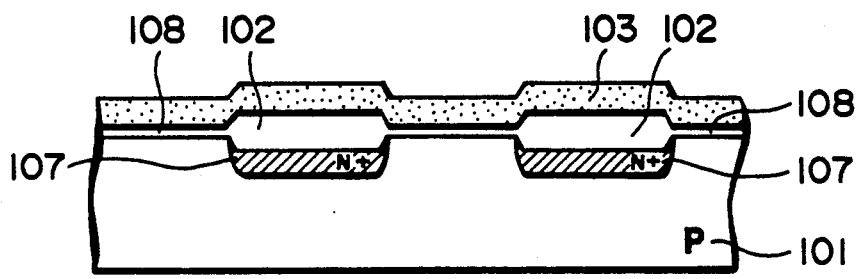
FIG. 11 is a cross-sectional view taken along line XI—XI of FIG. 9.

FIGS. 10 and 11 are sectional views in the X-direction. FIG. 10 shows a section at the second polysilicon layer wherein thick oxide films 102, 102 spaced apart from each other on the surface are formed on the surface of the p-type silicon substrate 101. On the surface of the silicon substrate 101 below the oxide films are formed $n^+$ type impurity regions 107 in an aligned manner. This $n^+$ type impurity region 107 functions as the source-drain region of the memory transistor. The substrate surface region which is sandwitched between a thick oxide films 102, 102 is recessed by etching to form a groove 109. On the bottom and the lateral sides of the groove 109 is formed a gate oxide film 108 thinner in thickness than the oxide film 102. The second polysilicon layer 104 is formed continuously when seen in cross-section over the gate oxide film 108 and the thick oxide film 102 and over the gate oxide film 108 of the adjacent memory transistor. This polysilicon layer 104 is formed adjacent to the gate oxide film 108 in a region defined between a pair of the thick oxide films 102, 102, and is isolated sufficiently from the n+ type impurity region 107 at these thick oxide films 102, 102. FIG. 11, which is the section of FIG. 9 taken in the X-direction, is taken at the first polysilicon layer 103. In the section of FIG. 11, thick oxide films 102 are formed in a spaced apart relation on the silicon substrate 101, and an n+ type region 107 is formed in an aligned manner below the oxide films. Thus n+ type impurity region 107 functions as the source-drain region of the memory transistor. However, the silicon substrate 101 is not etched off in a region between the oxide films 102, and a gate oxide film 108 is formed directly on the substrate surface. The first polysilicon layer 103 is extended continuously from above the gate oxide film 108 on the substrate surface to a region on the oxide film 102 in the direction of the section and thence to a region above the gate oxide film 108 of the adjacent memory transistor.

Figure 12:
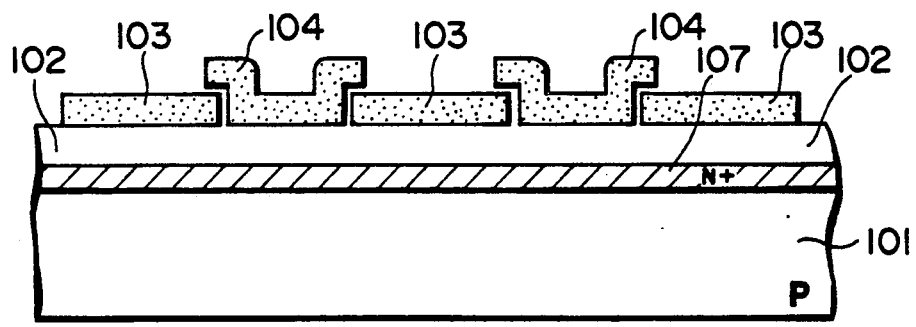
FIG. 12 is a cross-sectional view taken along line XII—XII of FIG. 9.
Figure 13:
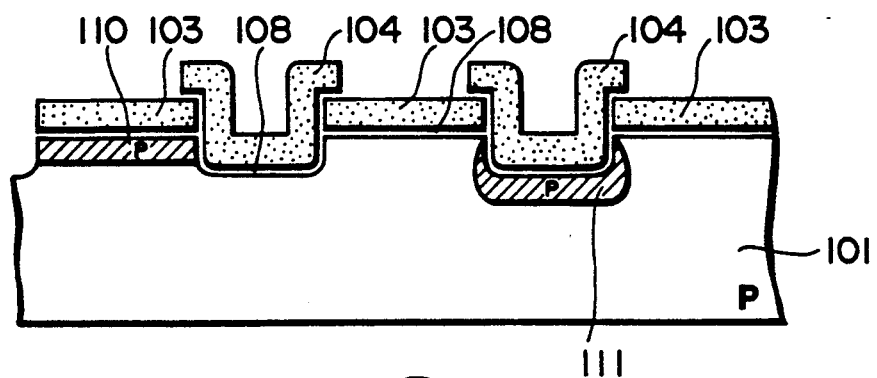
FIG. 13 is a cross-sectional view taken along line XIII—XIII of FIG. 9.

FIGS. 12 and 13 are sectional views of FIG. 9 taken in the Y-direction. FIG. 12 is a sectional view taken at the thick oxide film 102. A thick oxide film 102 is formed on the surface of a p-type silicon substrate 101 along a linear n+ type impurity region 107. On the oxide film 102, first polysilicon layers 103 and second polysilicon layers 104 are formed alternately. The edges of the second polysilicon layers 104 overlap with the edges of the first polysilicon layers 103 with the interposition of an interlayer insulating film, not shown. In FIG. 13, which is a sectional view taken at the channel-forming regions of the memory transistors, the region of the silicon substrate 101 in register with the second polysilicon layer, 104 is etched off, and the second polysilicon layer 104 is formed on a so-formed grove 109 with the interposition of a gate oxide film 108. The first polysilicon layer 103 is formed on a gate oxide film 108 formed on the substrate surface. The memory transistors are formed for each of the polysilicon layers 103, 104. Thus the channel-forming region of the substrate surface differs in height between the memory transistors which are adjacent to each other in the sectional direction. Into these channel-forming regions, there are selectively introduced p-type impurities to form impurity regions 110, 111, as shown in FIG. 12. The memory transistors in the channel-forming regions of which these impurity regions 110, 111 are formed, are not turned on even when selected by the word line potential being raised, so that a pair of the n+ type impurity regions 107, 107 functioning as the source-drain region are not rendered electrically conductive. On the other hand, the memory transistor not provided with the p-type impurity region, is rendered electrically conductive across a pair of n+ type impurity regions 107, 107 functioning as the source-drain region. Thus the programmed data may be read out on the basis of such difference in operation.

With the above described read-only memory device of the present embodiment, the p-type impurity region 107 functioning as the source-drain region is formed below the thick oxide film 102 to enable a high degree of integration to increase the ROM capacity. Since the memory cell structure is of the NOR type, the memory transistor are arranged side by side between the common source and the common drain. thus the memory cell driving capacity is not changed with the number of the transistors and positive and fast data read-out may be enabled with a sufficient driving capability. In addition, with the read-only memory device of the present embodiment, the electrode layers are formed by two polysilicon layers 103 and 104, and the second polysilicon layer 104 is formed in a region defined between the first polysilicon layers 103 parallel thereto, so that the memory transistors may be arrayed without interstices along the longitudinal direction of the thick oxide film 102 in a manner advantageous for higher integration. Above all, programming may be performed more reliably by providing a step difference between the lower end of the first polysilicon layer 103 and the lower end of the second polysilicon layer 104.

Figure 14A:
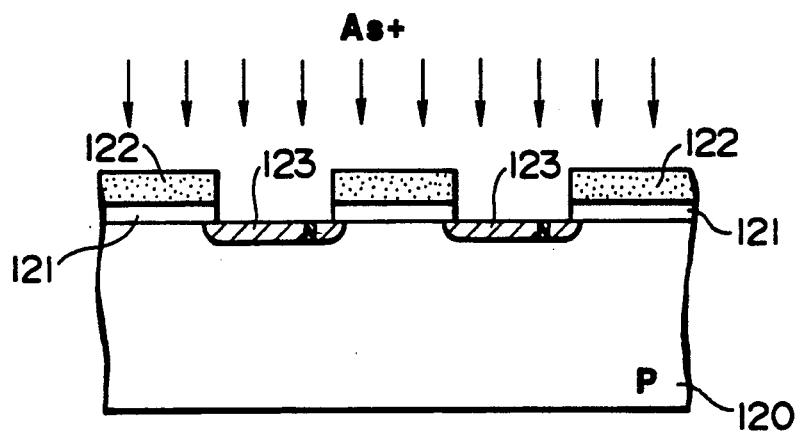
FIGS. 14a to 14c illustrate the steps for forming the source-drain region of the memory transistor of the memory device shown in FIG. 3.
Figure 14B:
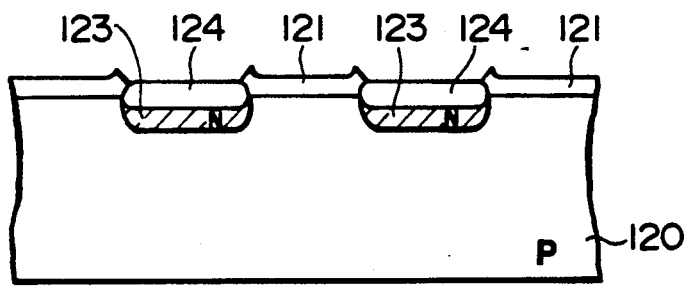
Figure 14C:
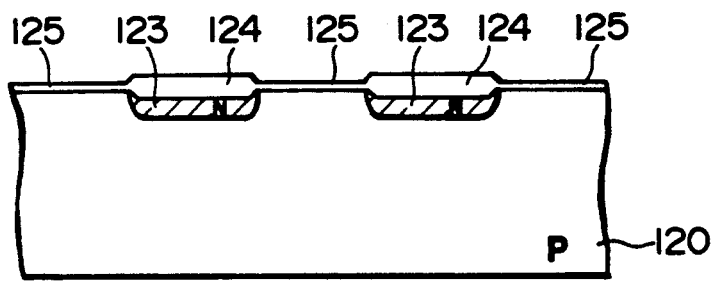

Process of Forming Source-Drain Region (FIGS. 14a to 14c)

Referring to FIGS. 14a to 14c, the method of forming a p-type impurity region 123 functioning as the source-drain region below a thick oxide film 124 is explained by referring to FIGS. 14a to 14c.

First of all, an oxidation resistant layer 121 formed by a silicon nitride film is formed on a p-type substrate 120 by means of a pad oxide film. A resist layer 122 is applied on the oxidation resistant layer 121. The resist layer 122 is exposed to a pattern for formation of a thick oxide film and developed. This pattern is comprised of a parallel array of band-shaped openings formed in the memory cell array region. With the use of the thus patterned resist layer 122, the oxidation resistant film 121 is patterned such as with the use of the RIE method. Then, as shown in FIG. 14a, n-type impurities, such as arsenic ions, are implanted to a high concentration, using the resist layers 122 and the oxidation resistant film 121 as the masks. By such ion implantation, n-type impurity regions 123 with the pattern of parallel stripes are formed on the surface of the silicon substrate 120. These n-type impurity regions 123 are formed in the same way as when forming channel stop regions in the lower portion of the usual field oxide films.

The resist layer 122 is removed by ashing, for example, and oxidized in its entirety. By this oxidation, a thick oxide film (LOCOS) 124 is formed on the surface of a region free of the oxidation resistant film 121, that is a region on which the n-type impurity region 123 is formed, as shown in FIG. 14b. In this manner by forming the thick oxide film 124, using the oxidation resistant film 121 as the mask, a thick oxide film 124 aligned with the n-type impurity region 123 may be produced.

The oxidation resistant film 121 is then removed and the region on which the oxidation resistant film 121 has been formed is oxidized to form a gate oxide film 125 as shown in FIG. 14c. The gate oxide film 125 has a thinner thickness than that of the oxide film 124.

Formation of electrodes or implantation of impurities for programming is then performed.

Figure 15A:
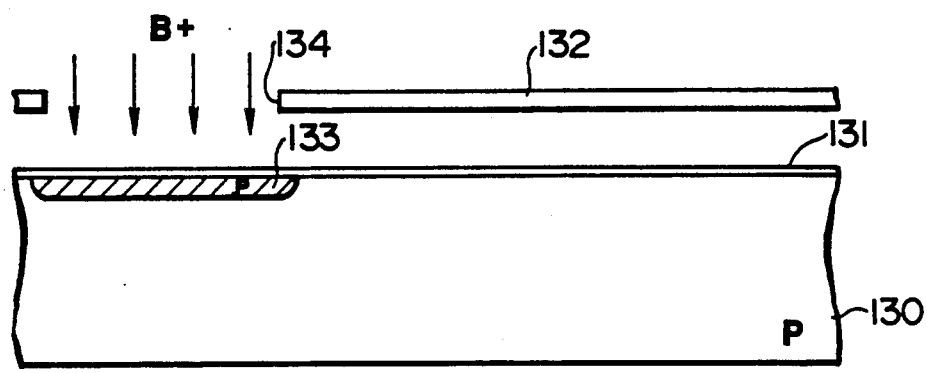
FIGS 15a to 15c illustrate the steps for forming the electrode layers of the memory transistor.
Figure 15B:
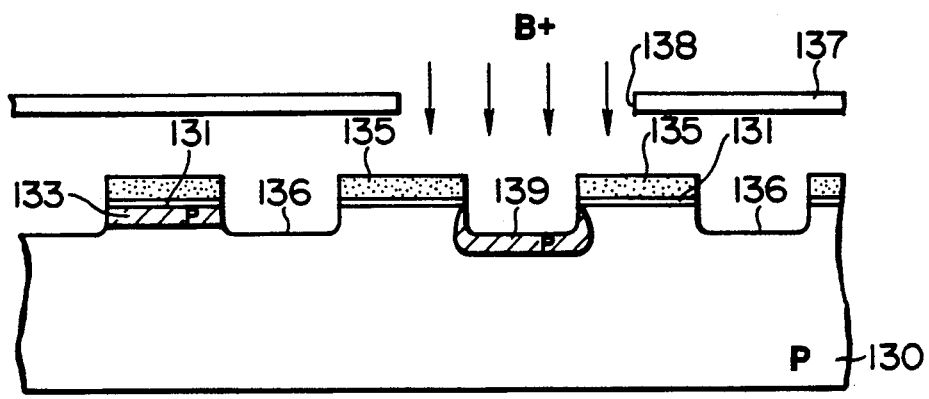
Figure 15C:
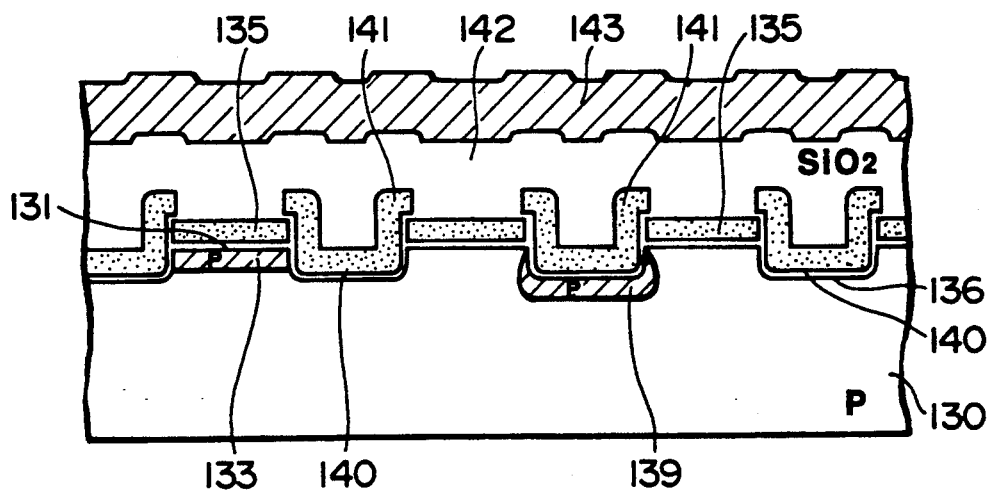

Program and Electrode Layer Forming Process (FIGS. 15a to 15c)

Referring to FIGS. 15a to 15c, the process of forming the electrode layers and selective impurity implantation for programming is explained.

Referring first to FIG. 15a, impurity ions are selectively implanted into the lower portion of a gate oxide film 131 of a silicon substrate 130. A mask 132 is used for the ion implantation and impurities are implanted into a exposed substrate surface portion in register with an opening 134 formed in the mask 132. The implanted impurities may for example be p-type impurities, such as boron, and the opening 134 in the mask 132 is wider than the channel-forming region for the memory transistor. It is because the thick oxide film functions as a part of the mask, as described previously. Also, since the substrate surface region outside the first polysilicon layer is etched off, as will be explained subsequently, ion implantation may be performed over a wide region without raising any problem. The mask 132 is formed by, for example, a resist layer. The region 133 into which the impurities are implanted in this manner prove to be a channel-forming region of the transistor having a high threshold voltage.

The mask 132 is then removed and first polysilicon layers 135 are formed on the overall surface of the gate oxide film 131. These first polysilicon layers 135 are formed as parallel stripes extending in a direction perpendicular to the drawing sheet. After patterning the first polysilicon layers 135, the gate oxide film 131 in the region between the first polysilicon layers 135 is removed, portions of the silicon substrate 130 thus exposed are etched off from above to form grooves 136 aligned with the first polysilicon layers 135. During this etching, the ends of the impurity region 133 formed to a wider width as described above are removed. With the ends of the impurity regions 133 thus etched off, it may be ensured that only the lower portion of the first polysilicon layer 135 is programmed.

After the groove 136 has been formed in alignment with the first polysilicon layer 135, a mask 137 having an opening 138 adapted for selective implantation of impurities is formed, as shown in FIG. 15b. This opening 138 is a window selectively formed in the region where the second polysilicon layer is to be formed, and is of an size larger than a region below the second polysilicon layer 136 where the channel region is to be formed. It is because the previously formed first polysilicon layer 135 and the thick oxide film function as a part of the mask. By such aligned programming, sufficient data writing may be assured even when the degree of circuit integration is to be raised. Using this mask 137, p-type impurities, such as boron, are implanted for selective impurity ion implantation into the grooves 136. Similarly to the region 133, the region 139 into which the impurities have been implanted in this manner is employed as the region for forming the transistor channel presenting a high threshold voltage.

The mask 137 is then removed and an interlayer oxide film and a gate oxide film 140 are formed by thermal oxidation. The interlayer oxide film covers the surface of the first polysilicon layer 135. The gate oxide film 140 is formed by oxiding the side wall and bottom surfaces of the groove 136. After formation of the interlayer oxide film and the gate oxide film 140, a second polysilicon layer 141 is formed on the overall surface such as by the CVD method. The second polysilicon layer 141 is formed along the side wall and bottom surfaces of the groove 136. After formation of the second polysilicon layer 141 on the overall surface, the second polysilicon layer 141 is subjected to patterning. This patterning is performed in such a manner that the second polysilicon layer 141 is formed into parallel stripes such that the second polysilicon layers 141 in the stripe form overlie the grooves 136 defined between the first polysilicon layers 135 so that the edges of the second polysilicon layers 141 overlap with the edges of the first polysilicon layers 135 with the interposition of interlayer oxide films. After formation of the second polysilicon layers 141, a silicon oxide film (e.g. PSG) 142 as the interlayer insulating film is formed. On the top of the silicon oxide film 142 is formed an aluminum wiring layer 143 in accordance with any desired pattern as shown in FIG. 15c. This aluminum wiring layer 143 functions as main bit lines or main column lines connected to n+ type impurity region below the thick oxide film. Passivation films may be formed in accordance with the usual process to complete the read-only memory device.

With the above described method for producing the read-only memory, since the impurity region 123 functioning as the source-drain region is formed below the thick oxide film 124, the source-drain region is not effected even when impurities for programming are introduced in alignment with the polysilicon layer. Since the two polysilicon layers are formed and the grooves 136 are formed in alignment with the first polysilicon layers 136, the openings 134, 138 of the masks 132, 137 for introducing impurities for programming may be of a wider size so that mask mismatching may be successfully coped with. A high density memory cell arraying may be assured by arranging the first polysilicon layer 135 and the second polysilicon layer 141 in a side-by-side relation and in sufficient proximity to each other with the interposition of thin interlayer oxidized films.

The grooves 136 below the second polysilicon layers are not indispensable as long as the problem of program mask matching may be solved. The electrode layer need not be a polysilicon layer and may be replaced by a refractory metal silicide or polysilicide or a refractory metal layer. The insulating film material need not be an oxide film but may also be a combination of the oxide film and the nitride film.

Figure 19:
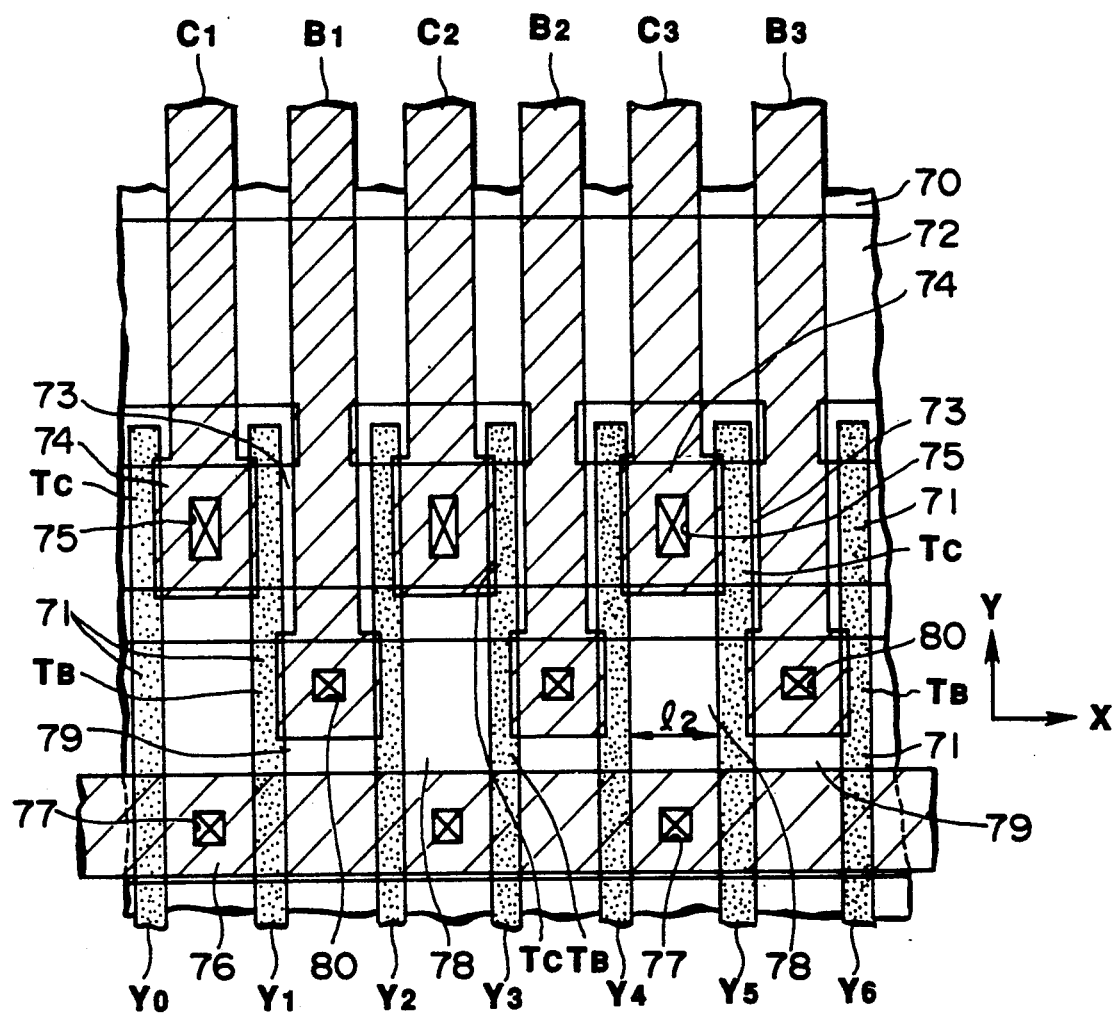
FIG. 19 is a plan view showing the layout of a column selection circuit of the memory device shown in FIG. 3.

Layout of Column Selection Circuit (FIG. 19)

FIG. 19 shows a layout of a portion of a column selection circuit. In the drawing, the region shown by numerous dots represent a polysilicon layer and represents signal lines 71 to which signals $Y_0$ to $Y_6$ from column decoder are supplied. These signal lines are extended as band in the Y-direction and arranged with an interval $l_2$ in the X-direction. Since the main bit line and the main column line are divided into two bit lines and two column lines respectively, the interval $l_2$ corresponds to twice the memory cell pitch.

The main column lines $C_1$, $C_2$ and $C_3$ and the main bit lines $B_1$, $B_2$ and $B_3$ are alternately formed in the Y-direction in band-like pattern as shown by hatched lines in FIG. 19. These main column lines $C_1$ to $C_3$ and the main bit lines $B_1$ to $B_3$ are formed by aluminum wire layers.

A ground line 72 formed by a diffusion region is formed on the silicon substrate 70. This ground line 72 is extended in the Y-direction below the main bit lines $B_1$ to $B_3$ and has an extended region 73 which proves to be one source/drain region of a selection transistor Tc. That is, the selection transistor Tc has its gate electrode formed by the signal line 71 and its the other drain/source region formed by a region 74. The region 74 connects to the main column lines $C_1$, $C_2$ and $C_3$ via contact hole 75 formed on the surface. Thus the regions 74 and 73 are rendered electrically conductive by the potential of the signal line 71, while the potential of the main column lines $C_1$, $C_2$ and $C_3$ is selectively set to the grounding potential. One extended region 73 proves to be the common source-drain of two selection transistors Tc. The lower region 74 of one contact hole 75 proves to be the common source-drain of two selection transistors Tc. This results in an improved circuit integration.

A data bus line 76 formed by an Al wiring layer is formed in a pattern of extending in the X-direction. This data bus line 76 is electrically connected to a diffusion region 78 via contact hole 79. This diffusion region 78 is opposite to a diffusion region 79 with the interposition of the signal line 71. These diffusion regions 78 and 79 function as the source-drain region of selection transistor $T_B$ having the signal line 71 as its gate electrode. Each diffusion region 79 is electrically connected to the main bit lines $B_1$, $B_2$ and $B_3$ by means of a contact hole 80. Thus the potentials or data appearing on the main bit lines $B_1$, $B_2$ and $B_3$ are such that only the column of the selected signal line 71 is electrically connected to the data bus line 76 and, and are outputted after amplification by the associated sense amplifier.

Second Embodiment

Figure 16:
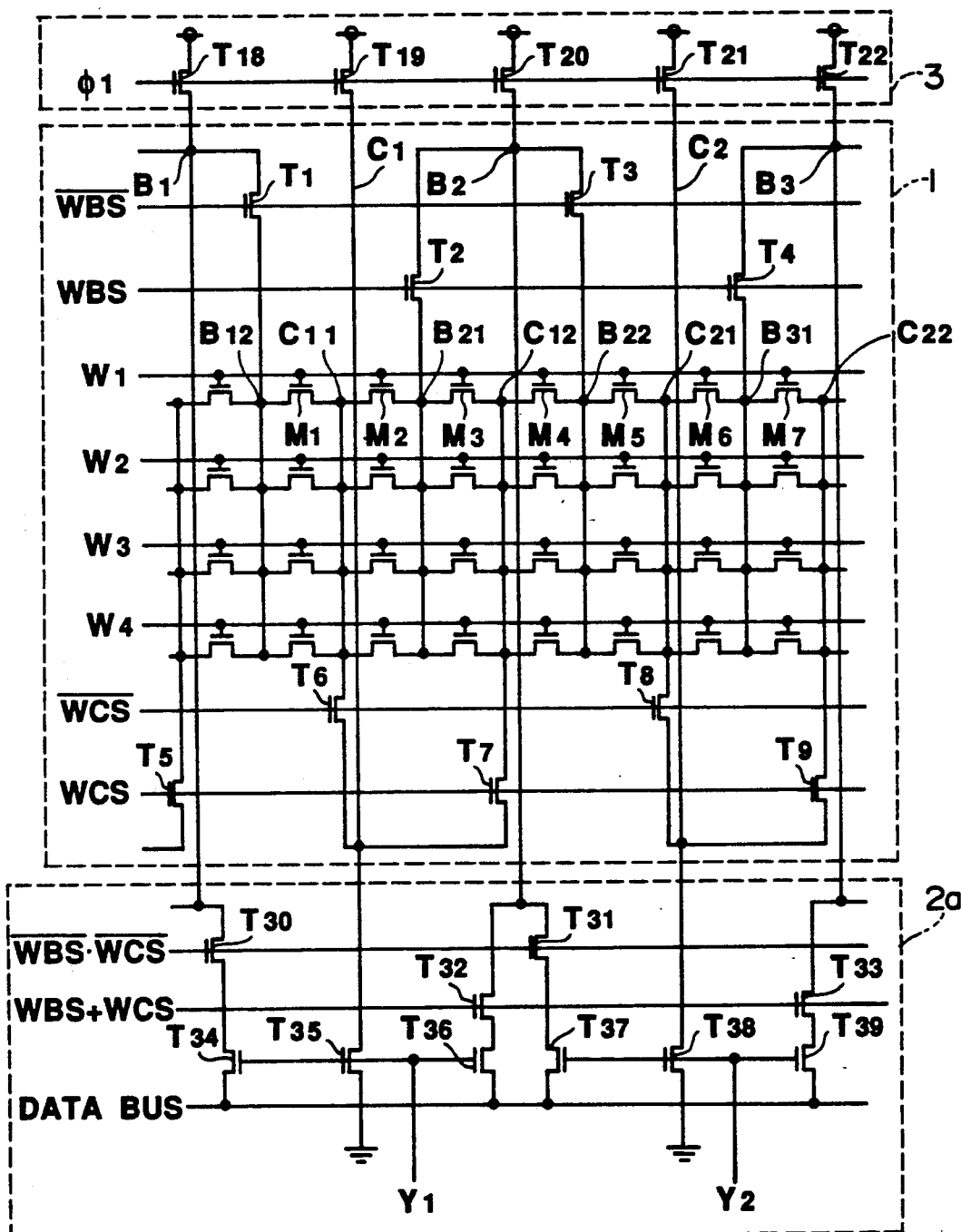
FIG. 16 is a circuit diagram showing essential portions of a modification of the read-only device according to the present invention.

The present embodiment is modified from the ROM of the first embodiment with respect to, above all, the circuit construction of the column selection circuit. Since the circuit construction is otherwise the same as the first embodiment, only the construction of the column selection circuit is hereinafter explained with reference to FIG. 16.

The column selection circuit $2a$ is used for electrically connecting the data bus line and the ground line selectively to the main bit lines $B_1$ to $B_3$ or the main column lines of the memory cell block 1, and is controlled on the basis of the signal $Y_1$ and $Y_2$.

The main column lines $C_1$ and $C_2$ of the column selection circuit $2a$ of the present embodiment are directly controlled on the basis of the signals $Y_1$ and $Y_2$. That is, the main column line $C_1$ is connected to the ground line by means of a MOS transistor $T_{35}$, to the gate of which the signal $Y_1$ is supplied. The main column line $C_2$ is connected to the ground line by means of a MOS transistor $T_{38}$, to the gate of which the signal $Y_2$ is supplied.

The main bit lines $B_1$, $B_2$ and $B_3$, controlled by the signals $Y_1$ and $Y_2$, need to be selected in accordance with the selected bit line in the same group. To this end, MOS transistors are provided which operate on the basis of signals over selection lines WBS, WCS, $\overline{WBS}$ and $\overline{WCS}$. Thus the main bit line $B_1$ is electrically connected to the data bus line by means of serially connected MOS transistors $T_{34}$ and $T_{30}$. The main bit line $B_2$ is connected to be data bus line by a first channel including serially connected MOS transistors $T_{36}$ and $T_{32}$ and a second channel including serially connected MOS transistors $T_{37}$ and $T_{31}$. The main bit line $B_3$ is electrically connected to the data bus line by means of serially connected MOS transistors $T_{33}$ and $T_{39}$. Meanwhile, although the main bit lines $B_1$ and $B_3$ may also have two channels, they are not illustrated for simplicity. The MOS transistor $T_{30}$, $T_{31}$ are turned on by the logical product of the signals on selection lines $\overline{WBS}$ and $\overline{WCS}$, while the MOS transistor $T_{32}$, $T_{33}$ are turned on by the logical sum of the signals on selection lines WBS and WCS. Thus the MOS transistors $T_{30}$, $T_{32}$ are not turned on simultaneously, while the MOS transistor $T_{31}$, $T_{33}$ are not turned on simultaneously. Therefore, when a group has been selected by the signal $Y_1$ and $Y_2$, the main bit lines $B_1$ to $B_3$ are selected alternatively and further the operation of selecting the bit and column lines is performed for reading out data from one cell.

With the column selection circuit $2a$ of the present embodiment, the number of the transistors is significantly reduced as compared to the column selection circuit 2 of the preceding first embodiment, so that reduction in the area occupied by column selection circuit $2a$ may be achieved easily.

Third Embodiment

The present embodiment is modified from the ROM of the preceding first embodiment with respect to the circuit construction of the load circuit and the column selection circuit. Since the circuit construction is otherwise the same as the preceding first embodiment, only the different circuit portions will be explained with reference to FIGS. 17 and 18.

Figure 17:
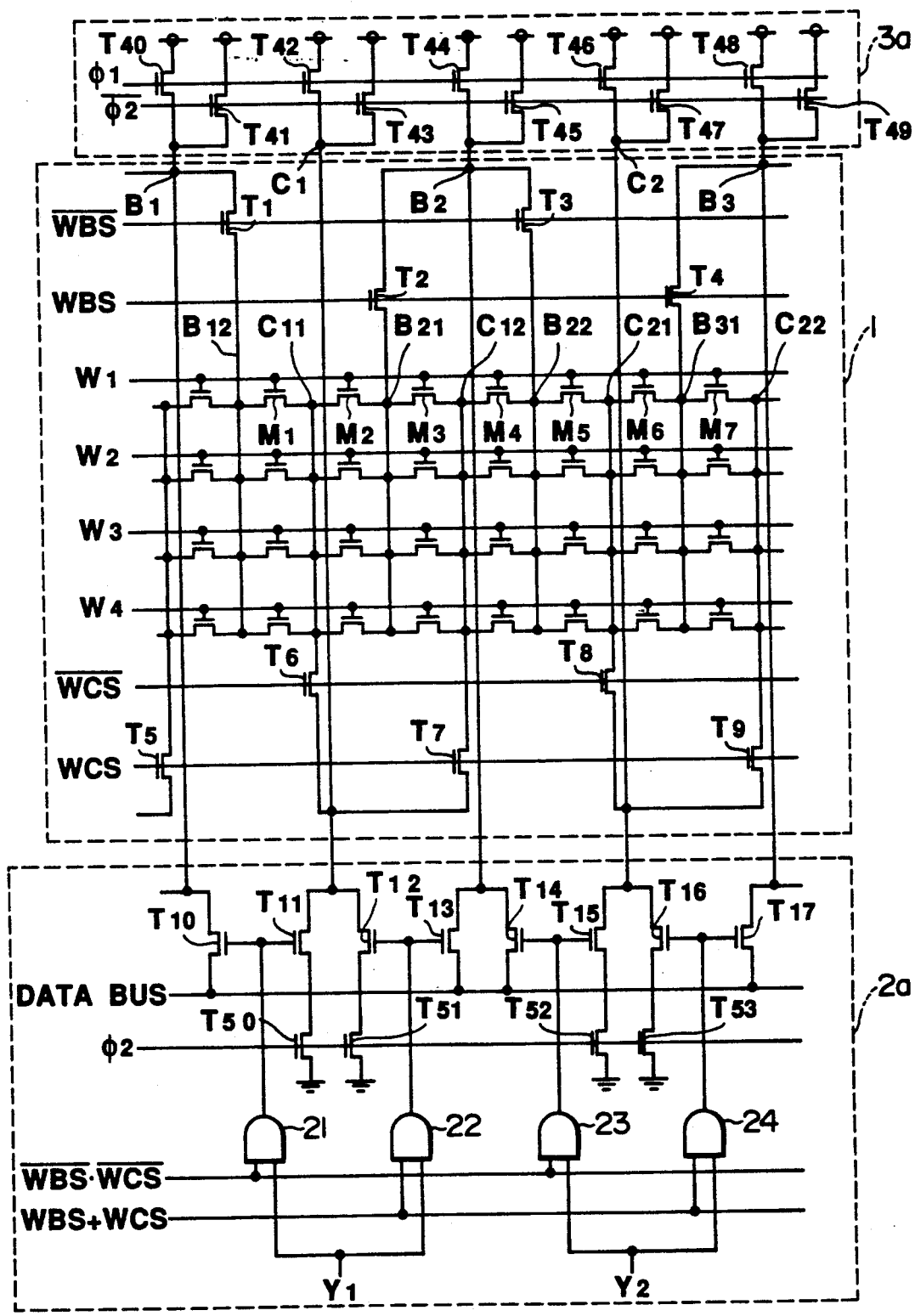
FIG. 17 is a circuit diagram showing essential portions of a further modification of the read-only memory device according to the present invention.

As shown in FIG. 17, the ROM of the present embodiment has the memory cell block 1 similar to that of the first embodiment. This memory cell block 1 has the main bit lines $B_1$, $B_2$ and $B_3$ and main column lines $C_1$ and $C_2$ extending in a direction perpendicular to the word line direction. Two bit lines and two column lines are divided out from each of these main bit lines and main column lines as in the case of the first embodiment.

A load circuit $3a$ is provided at a terminal end of the memory cell block in the extending direction of the bit lines. This load circuit $3a$ has precharging MOS transistors $T_{41}$, $T_{43}$, $T_{45}$, $T_{47}$ and $T_{49}$, in addition to MOS transistors $T_{40}$, $T_{42}$, $T_{44}$, $T_{46}$ and $T_{48}$ providing predetermined impedances to the main bit lines $B_1$ to $B_3$ and main column lines $C_1$ and $C_2$. One source-drain regions of the MOS transistors $T_{40}$, $T_{42}$, $T_{44}$, $T_{46}$ and $T_{48}$ are connected to a power source line, while the other source-drain regions thereof are connected to the main bit lines or main column lines. A signal $\phi_1$ is supplied to the gates of these MOS transistors $T_{40}$, $T_{42}$ $T_{44}$, $T_{46}$ and $T_{48}$. The source-drain regions of the MOS transistors $T_{41}$, $T_{43}$, $T_{45}$, $T_{47}$ and $T_{49}$ are connected to the main bit or column lines and the other source-drain regions thereof are similarly connected to the power source line. The signal $\overline{\phi_2}$ is supplied to the gate of these MOS transistors $T_{41}$, $T_{43}$, $T_{47}$ and $T_{49}$. The signal $\overline{\phi_2}$ is raised to "H" level when the selected memory transistor is switched, as will be explained subsequently. Precharging is performed when the signal $\overline{\phi_2}$ is raised to the "H" level.

A column selection circuit $2b$ is provided at the other terminal end of the memory cell block 1 in the extending direction of the bit lines. With the column selection circuit $2b$, having a similar construction to that of the column selection circuit 2 of the first embodiment MOS transistors $T_{50}$, $T_{51}$, $T_{52}$ and $T_{53}$ functioning as switches, are formed between the MOS transistors $T_{11}$, $T_{12}$, $T_{15}$ and $T_{16}$ and the ground line. Each of these MOS transistors $T_{50}$, $T_{15}$, $T_{52}$ and $T_{53}$ has its gate supplied with the signal $\phi_2$ and is turned on or off when the signal $\phi_2$ is at the "H" level or at the "L" level, respectively. With the MOS transistors $T_{50}$, $T_{51}$, $T_{52}$ and $T_{53}$ turned off, the main column lines $C_1$ and $C_2$ disconnected from the ground level to enable effective precharging.

Figure 18:
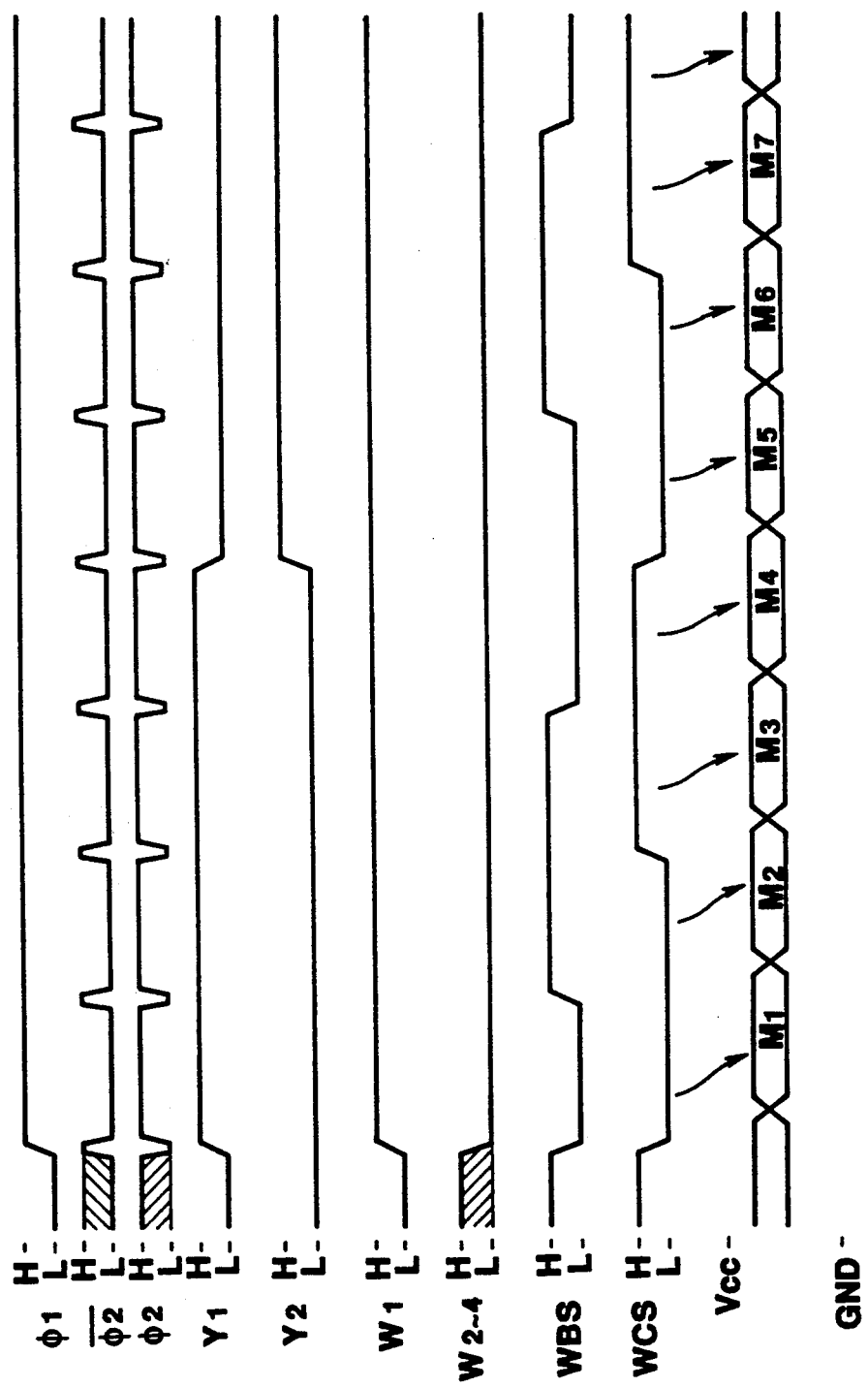
FIG. 18 is a timing chart for illustrating the operation of the memory device shown in FIG. 17.

Referring now to FIG. 18, the operation of the ROM of the third embodiment is briefly explained. Since the operation of the present embodiment is the operation of the first embodiment combined with the precharging operation, the operation of precharging is explained briefly.

At the start of a given cycle, the signal $\overline{\phi_2}$ rises from the "L" level to the "H" level, as a result of which the MOS transistors $T_{41}$, $T_{43}$, $T_{45}$, $T_{47}$ and $T_{49}$ of the load circuit $3a$ are turned on. On the other hand, with the falling of the signal $\phi_2$, the MOS transistors $T_{50}$, $T_{51}$, $T_{52}$ and $T_{53}$ of the column selection circuit $2b$ are turned off, as a result of which the potential of the main column lines $C_1$ and $C_2$ and the main bit lines $B_1$ to $B_3$ is raised to the level of the source voltage Vcc.

After such precharging, and before start of the driving of the memory transistor of the memory cell block 1, the signals $\bar{\phi}_2$ and $\phi_2$ are brought to the "L" level and "H" level, respectively. Thus the MOS transistors $T_{41}$, $T_{43}$, $T_{45}$, $T_{47}$ and $T_{49}$ are turned off and the MOS transistors $T_{50}$, $T_{51}$, $T_{52}$ and $T_{53}$ are turned on. This enables data to be read out so that the read-out operation is performed similarly to the first embodiment.

With the above described ROM of the third embodiment, high-speed data read-out may be enabled by precharging of the main bit lines and main column lines.

Although two bit lines and two column lines are associated with each main bit line and main column line, respectively, in the above embodiments, the present invention is not limited thereto but may be adapted to various other modifications.

What is claimed is:

1. A read-only memory device for storing programmed data and subsequently reading out the stored data, comprising
   a plurality of memory cells arranged in rows and columns in a matrix configuration and including MIS (metal insulated semiconductor) transistors which may be selectively set to a high threshold voltage or to a low threshold voltage in accordance with programmed data,
   a plurality of word lines used in common in each row of said cells and connected to gates of said MIS transistors,
   a plurality of bit lines arranged substantially orthogonally to said word lines, said bit lines connected as one of the sources or the drains of said MIS transistors and being used in common for data read-out by one of adjacent columns of said memory cells,
   a plurality of column lines arranged between said bit lines in alternation with and parallel to said bit lines, said column lines being used in common by the other of adjacent columns of said memory cells and functioning as the other of said sources or drains of said MIS transistors of columns of said cells, a potential difference higher than said low threshold voltage and lower than said high threshold voltage of said MIS transistor being applied on selection with respect to the voltage at said word line,
   first selection means for selecting groups each consisting of a plurality of said bit lines and a plurality of said column lines,
   second selection means for selecting said bit lines in each group, and
   third selection means for selecting said column lines in each group.

2. The read-only memory device according to claim 1, wherein said second and third selection means comprise MIS transistors.

3. The read-only memory device according to claim 2, wherein said bit lines and said column lines are formed in a striped pattern on a substrate and wherein a direction substantially orthogonal to the longitudinal direction of said striped pattern is the channel direction of said MIS transistors constituting said second and third selection means.

4. The read-only memory device according to claim 1 or 3, wherein said second selection means is arranged in opposition to said third selection means with an array of said memory cells inbetween.

5. The read-only memory device according to claim 1, wherein said memory cells in the matrix configuration are divided into blocks along the bit lines and wherein said first selection means are used in common in each block.

6. The read-only memory device according to claim 1, wherein load circuits are arranged at terminal ends of each bit line and each column line.

7. The read-only memory device according to claim 6, wherein said memory cells in the matrix configuration are divided into blocks along the bit lines and wherein the load circuits are used in common by each block.

* * * * *